United States Patent
Onuki et al.

(10) Patent No.: US 11,568,944 B2
(45) Date of Patent: Jan. 31, 2023

(54) SEMICONDUCTOR DEVICE COMPRISING MEMORY CELLS

(71) Applicant: SEMICONDUCTOR ENERGY LABORATORY CO., LTD., Atsugi (JP)

(72) Inventors: Tatsuya Onuki, Kanagawa (JP); Takanori Matsuzaki, Kanagawa (JP); Tomoaki Atsumi, Kanagawa (JP); Shunpei Yamazaki, Tokyo (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 17/286,538

(22) PCT Filed: Oct. 29, 2019

(86) PCT No.: PCT/IB2019/059245
§ 371 (c)(1),
(2) Date: Apr. 19, 2021

(87) PCT Pub. No.: WO2020/095148
PCT Pub. Date: May 14, 2020

(65) Prior Publication Data
US 2021/0383881 A1  Dec. 9, 2021

(30) Foreign Application Priority Data
Nov. 8, 2018  (JP) .............................. JP2018-210695

(51) Int. Cl.
*G11C 16/04* (2006.01)
*G11C 16/34* (2006.01)
(Continued)

(52) U.S. Cl.
CPC ...... *G11C 16/3459* (2013.01); *G11C 16/0483* (2013.01); *G11C 16/12* (2013.01);
(Continued)

(58) Field of Classification Search
CPC . G11C 16/3459; G11C 16/0483; G11C 16/12; G11C 16/0408; G11C 16/0466;
(Continued)

(56) References Cited

U.S. PATENT DOCUMENTS

| 5,453,952 A | 9/1995 | Okudaira et al. |
| 6,885,579 B2 * | 4/2005 | Sakimura ................ G11C 11/15 |
| | | 365/158 |

(Continued)

FOREIGN PATENT DOCUMENTS

| JP | 56-111194 A | 9/1981 |
| JP | 61-000999 A | 1/1986 |

(Continued)

OTHER PUBLICATIONS

International Search Report (Application No. PCT/IB2019/059245) dated Jan. 28, 2020.
(Continued)

*Primary Examiner* — Tha-O H Bui
(74) *Attorney, Agent, or Firm* — Nixon Peabody LLP; Jeffrey L. Costellia

(57) ABSTRACT

A semiconductor device that writes data to, instead of a defective memory cell, another memory cell is provided. The semiconductor device includes a first circuit and a second circuit over the first circuit; the first circuit corresponds to a memory portion and includes a memory cell and a redundant memory cell; a second circuit corresponds to a control portion and includes a third circuit and a fourth circuit. The memory cell is electrically connected to the third circuit, the redundant memory cell is electrically connected
(Continued)

to the third circuit, and the third circuit is electrically connected to the fourth circuit. The fourth circuit has a function of sending data to be written to the memory cell or the redundant memory cell to the third circuit, and the third circuit has a function of bringing the memory cell and the fourth circuit into a non-conduction state and the redundant memory cell and the fourth circuit into a conduction state to send the data to the redundant memory cell when the memory cell is a defective cell.

9 Claims, 17 Drawing Sheets

(51) Int. Cl.
　　　*G11C 16/12*　　　(2006.01)
　　　*H01L 27/12*　　　(2006.01)
(52) U.S. Cl.
　　　CPC ...... *G11C 16/0408* (2013.01); *G11C 16/0466* (2013.01); *H01L 27/1225* (2013.01)
(58) Field of Classification Search
　　　CPC ....... G11C 16/08; G11C 11/16; G11C 11/401; G11C 11/41; G11C 13/0002; G11C 14/0054; G11C 16/10; G11C 29/00
　　　USPC .................................................. 365/185.17
　　　See application file for complete search history.

(56) References Cited

U.S. PATENT DOCUMENTS

| | | | |
|---|---|---|---|
| 7,773,436 B2 | 8/2010 | Inoue et al. | |
| 8,111,567 B2 | 2/2012 | Inoue et al. | |
| 8,358,545 B2* | 1/2013 | Sako ...................... | G11C 29/82 365/185.21 |
| 8,520,457 B2 | 8/2013 | Inoue et al. | |
| 9,542,977 B2 | 1/2017 | Onuki et al. | |
| 9,601,178 B2 | 3/2017 | Yamazaki et al. | |
| 9,748,274 B2 | 8/2017 | Ishizu et al. | |
| 9,831,238 B2 | 11/2017 | Yamazaki et al. | |
| 9,837,157 B2 | 12/2017 | Tamura | |
| 10,056,131 B2 | 8/2018 | Atsumi et al. | |
| 10,388,380 B2 | 8/2019 | Tamura | |
| 10,497,419 B2 | 12/2019 | Yamazaki et al. | |
| 10,522,693 B2 | 12/2019 | Kurokawa | |
| 10,936,410 B2 | 3/2021 | Tsutsui | |
| 10,964,393 B2 | 3/2021 | Tamura | |
| 2006/0083047 A1* | 4/2006 | Fujita ................. | G11C 14/0081 365/145 |
| 2008/0151660 A1 | 6/2008 | Inoue et al. | |
| 2009/0307415 A1* | 12/2009 | Kang ................ | H01L 27/11551 711/E12.008 |
| 2012/0188814 A1 | 7/2012 | Yamazaki et al. | |
| 2015/0294693 A1 | 10/2015 | Onuki et al. | |
| 2015/0340094 A1 | 11/2015 | Tamura | |
| 2016/0350182 A1 | 12/2016 | Tsutsui | |
| 2016/0351576 A1 | 12/2016 | Yamazaki et al. | |
| 2020/0098416 A1 | 3/2020 | Yamazaki et al. | |
| 2020/0381056 A1 | 12/2020 | Tamura | |

FOREIGN PATENT DOCUMENTS

| | | |
|---|---|---|
| JP | 05-102430 A | 4/1993 |
| JP | 2008-181634 A | 8/2008 |
| JP | 2012-256837 A | 12/2012 |
| JP | 2015-207761 A | 11/2015 |
| JP | 2015-228493 A | 12/2015 |
| JP | 2016-001729 A | 1/2016 |
| JP | 2016-224932 A | 12/2016 |
| KR | 2008-0060157 A | 7/2008 |
| KR | 2012-0099344 A | 9/2012 |
| KR | 2015-0135128 A | 12/2015 |

OTHER PUBLICATIONS

Written Opinion (Application No. PCT/IB2019/059245) dated Jan. 28, 2020.

\* cited by examiner

SEMICONDUCTOR DEVICE COMPRISING MEMORY CELLS

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof; a manufacturing method thereof; and a testing method thereof.

BACKGROUND ART

Electronic components such as central processing units (CPUs), graphics processing units (GPUs), memory devices, and sensors have been used in various electronic devices such as personal computers, smartphones, and digital cameras; the electronic components have been improved in various aspects such as miniaturization and low power consumption.

The amount of data used by the electronic devices or the like has been increased in recent years. As data increase, errors of data (defective bit) increase; thus, error correction techniques have been improved. For example, Patent Document 1 discloses a memory system which has a simplified defective-block-control system and can efficiently use a memory.

REFERENCE

Patent Document

[Patent Document 1] Japanese Published Patent Application No. 2016-224932

SUMMARY OF THE INVENTION

Problems to be Solved by the Invention

It is known that a NAND structure memory device (hereinafter referred to as a NAND memory device), one of memory devices, generally has low rewrite endurance. Hence, the NAND memory device writes and reads data using an error correction technique in some cases. Once the NAND memory device finds a defective bit in writing or reading, a redundant cell can be used instead of the cell retaining the defective bit, which is one of the error correction techniques.

However, additional word lines, bit lines and a memory cell array are needed to provide a redundant cell which substitutes for the cell retaining a defective bit, which may expand the circuit area in the whole memory device.

An object of one embodiment of the present invention is to provide a novel semiconductor device. Another object of one embodiment of the present invention is to provide a semiconductor device with a small circuit area. Another object of one embodiment of the present invention is to provide a semiconductor device with reduced power consumption. Another object of one embodiment of the present invention is to provide a novel electronic device including the semiconductor device.

Note that the objects of one embodiment of the present invention are not limited to the objects listed above. The objects listed above do not preclude the existence of other objects. Note that the other objects are objects that are not described in this section and will be described below. The objects that are not described in this section will be derived from the description of the specification, the drawings, and the like and can be extracted from the description by those skilled in the art. Note that one embodiment of the present invention does not necessarily solve all the objects listed above and the other objects. Note that one embodiment of the present invention does not necessarily solve all the objects listed above and the other objects.

Means for Solving the Problems (1)

One embodiment of the present invention is a semiconductor device including a first circuit and a second circuit over the first circuit. The first circuit is electrically connected to the second circuit. The first circuit includes a first memory cell and a second memory cell. The second circuit includes a third circuit and a fourth circuit. The first memory cell is electrically connected to the third circuit. The second memory cell is electrically connected to the third circuit. The third circuit is electrically connected to the fourth circuit. The fourth circuit has a function of sending data to be written to the first memory cell or the second memory cell to the third circuit. The third circuit has a function of bringing the first memory cell and the fourth circuit into a non-conduction state and the second memory cell and the fourth circuit into a conduction state to send the data to the second memory cell when the first memory cell is a defective cell.

(2)

In addition, one embodiment of the present invention is, in the above (1) structure, the semiconductor device in which the third circuit includes a first switch and a second switch. The first memory cell is electrically connected to a first terminal of the first switch. A second terminal of the first switch is electrically connected to the fourth circuit. The second memory cell is electrically connected to a first terminal of the second switch. A second terminal of the second switch is electrically connected to the fourth circuit.

(3)

In addition, one embodiment of the present invention is, in the above (2) structure, the semiconductor device in which the third circuit includes a fifth circuit. The fifth circuit is electrically connected to a control terminal of the first switch and a control terminal of the second switch. The fifth circuit has a function of inputting a voltage which brings the first switch into a non-conduction state to the control terminal of the first switch and inputting a voltage which brings the second switch into a conduction state to the control terminal of the second switch when the fifth circuit receives a signal including information in which the first memory cell is a defective cell.

(4)

In addition, one embodiment of the present invention is, in the above (2) or (3) structure, the semiconductor device in which the first switch includes a first transistor. The second switch includes a second transistor. The first transistor and the second transistor each include a metal oxide in its channel formation region.

(5)

In addition, one embodiment of the present invention n the above (1) structure, the semiconductor device in which the third circuit includes a third switch. The third switch includes a first terminal, a second terminal, a third terminal, and a control terminal. The first terminal of the third switch is electrically connected to the fourth circuit. The second terminal of the third switch is electrically connected to the first memory cell. The third terminal of the third switch is electrically connected to the second memory cell. The third switch has a function of bringing the first terminal of the third switch and one of the second terminal or the third terminal of the third switch into a conduction state and the first terminal of the third switch and the other of the second terminal or the third ten final of the third switch into a non-conduction state depending on a voltage input to the control terminal.

(6)

In addition, one embodiment of the present invention is, in the above (5) structure, the semiconductor device in which the third circuit includes a fifth circuit. The fifth circuit is electrically connected to the control circuit of the third switch. The fifth circuit inputs a voltage which brings the first terminal and the second terminal of the third switch into a non-conduction state and the first terminal and the third terminal of the third switch into a conduction state when the fifth circuit receives information in which the first memory cell is a defective cell.

(7)

In addition, one embodiment of the present invention is, in the above (6) structure, the semiconductor device in which the third switch includes a third transistor, and the third transistor includes a metal oxide in its channel formation region.

(8)

In addition, one embodiment of the present invention is, in the above (1) to (7) structure, the semiconductor device in which the second circuit is composed of a single-polar circuit.

(9)

In addition, one embodiment of the present invention is, in the above (1) to (8) structure, the semiconductor device in which the first circuit includes a NAND memory device, and the NAND memory device includes the first memory cell and the second memory cell.

(10)

In addition, one embodiment of the present invention is an electronic device including the semiconductor device of any one of the above (1) to (9) structure and a housing.

Note that in this specification and the like, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow an electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to determine whether current flows or not.

An example of the case where X and Y are functionally connected is the case where one or more circuits that allow functional connection between X and Y (e.g., a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (e.g., a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y.

Note that an explicit description, X and Y are electrically connected, includes the case where X and Y are electrically connected (i.e., the case where X and Y are connected with another element or another circuit provided therebetween), the case where X and Y are functionally connected (i.e., the case where X and Y are connected with another circuit provided therebetween), and the case where X and Y are directly connected (i.e., the case where X and Y are connected without another element or another circuit provided therebetween). That is, the explicit expression "X and Y are electrically connected" is the same as the explicit simple expression "X and Y are connected".

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

In this specification and the like, a transistor includes three terminals called a gate, a source, and a drain. The gate functions as a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" are interchangeable in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. The "voltage" refers to a potential difference from a reference potential. When the reference potential is a ground potential, for example, the "voltage" can be expressed as the "potential". The ground potential does not necessarily mean 0 V. Potentials are relative values, and a potential supplied to a wiring or the like is sometimes changed depending on the reference potential.

"Current" is defined as a charge transfer (electrical conduction) accompanied by transfer of positively charged particles; for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of current in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used in order to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments or claims. Alternatively, for example, in this specification and the like, a "first" component in one embodiment can be omitted in other embodiments or claims.

In this specification and the like, terms for describing arrangement, such as "over" and "under", are sometimes used for convenience to describe the positional relation between components with reference to drawings. The positional relation between components is changed as appropriate in accordance with a direction in which each component is described. Thus, terms for the description are not limited to terms used in the specification and the like, and the description can be made appropriately depending on the situation. For example, the expression "an insulator over (on) a top surface of a conductor" can be replaced with the expression "an insulator on a bottom surface of a conductor" when the direction of a drawing showing these components is rotated by 180°.

Furthermore, the term "over" or "under" does not necessarily mean that a component is placed directly on or directly under and in direct contact with another component. For example, the expression "electrode B over insulating layer A" does not necessarily mean that the electrode B is on and in direct contact with the insulating layer A and can mean the case where another component is provided between the insulating layer A and the electrode B.

In this specification and the like, the terms "film", "layer", and the like can be interchanged with each other according to circumstances. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the term such as "electrode" or "wiring" does not limit the function of a component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Inversely, the term "signal line", "power supply line", or the like can be changed into the term "wiring" in some cases. The term "power supply line" or the like can be changed into the term "signal line" or the like in some cases. Inversely, the term "signal line" or the like can be changed into the term "power supply line" or the like in some cases. The term "potential" that is applied to a wiring can be changed into the term "signal" or the like depending on the case or according to circumstances. Inversely, the term "signal" or the like can be changed into the term "potential" in some cases.

In this specification and the like, an impurity in a semiconductor refers to an element other than a main component of a semiconductor layer, for example. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, when the semiconductor is a silicon layer, examples of an impurity that changes characteristics of the semiconductor include oxygen, Group 1 elements except hydrogen, Group 2 elements, Group 13 elements, and Group 15 elements.

In this specification and the like, a switch is in a conduction state (on state) or a non-conduction state (off state) to determine whether current flows or not. Alternatively, a switch has a function of selecting and changing a current path. For example, an electrical switch or a mechanical switch can be used. That is, a switch can be any element capable of controlling current, and is not limited to a certain element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

Effect of the Invention

One embodiment of the present invention can provide a novel semiconductor device. Furthermore, one embodiment of the present invention can provide a semiconductor device with a small circuit area. Furthermore, one embodiment of the present invention can provide a semiconductor device with reduced power consumption. In addition, one embodiment of the present invention can provide a novel electronic device including the semiconductor device.

Note that the effects of one embodiment of the present invention are not limited to the effects listed above. The effects listed above do not preclude the existence of other effects. Note that the other effects are effects that are not described in this section and will be described below. The other effects that are not described in this section will be derived from the description of the specification, the drawings, and the like and can be extracted from the description by those skilled in the art. Note that one embodiment of the present invention has at least one of the effects listed above and the other effects. Accordingly, depending on the case, one embodiment of the present invention does not have the effects listed above in some cases.

MODE FOR CARRYING OUT THE INVENTION

Figure 1A:
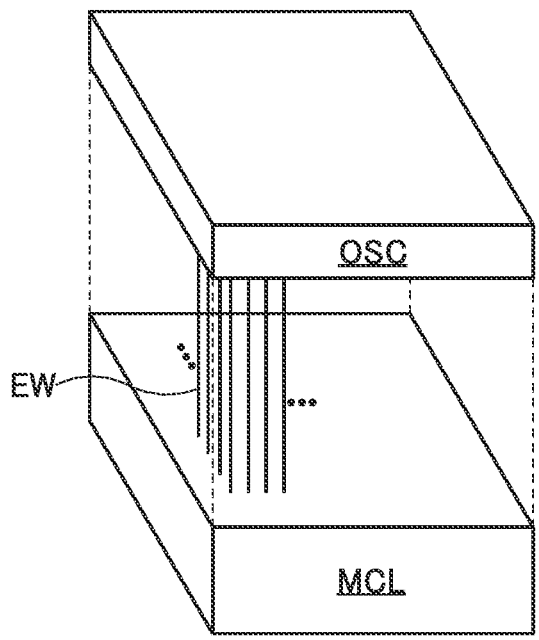
FIG. 1A, FIG. 1B, and FIG. 1C are schematic views showing a structure of a semiconductor device, FIG. 2A, FIG. 2B, and FIG. 2C area block diagram and schematic views showing a structure of a semiconductor device.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor or shortly as an OS. In the case where an OS transistor is mentioned, the OS transistor can also be referred to as a transistor including a metal oxide or an oxide semiconductor.

Furthermore, in this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described with reference to a variety of diagrams or a content described with text disclosed in this specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference numerals, and in particular need to be distinguished from each other, an identification sign such as "_1", "[n]", or "[m, n]" is sometimes added to the reference numerals.

In the drawings in this specification, the size, the layer thickness, or the region is exaggerated for clarity in some cases. Therefore, they are not limited to the illustrated scale. Note that the drawings are schematic views showing ideal examples, and embodiments of the present invention are not limited to shapes or values shown in the drawings. For example, the following can be included: variation in signal, voltage, or current due to noise or difference in timing.

Embodiment 1

In this embodiment, a semiconductor device including a memory cell unit MCL and a peripheral circuit OSC is described.

The semiconductor device shown in FIG. 1A has a structure in which the peripheral circuit OSC overlaps the memory cell unit MCL. The memory cell unit MCL has memory cells over a substrate, and reading and writing are performed by the peripheral circuit OSC. FIG. 1A does not show a substrate.

A substrate which can be used for the semiconductor device is, for example, a single crystal semiconductor substrate or a polycrystalline semiconductor substrate using silicon, silicon carbide, or the like as a material or a compound semiconductor substrate using silicon germanium or the like as a material. An SOI substrate, a semiconductor substrate on which a semiconductor element such as a strained transistor or a FIN-type transistor can be provided as a substrate, for example. Furthermore, a glass substrate of barium borosilicate glass, aluminoborosilicate glass, or the like, a ceramic substrate, a quartz substrate, a sapphire substrate, or the like can be used as a substrate. A flexible substrate may be used as the substrate, for example.

The substrate is preferably selected in accordance with the structure of the memory cells included in the memory cell unit MCL. For example, when the memory cell unit MCL includes a three-dimensional NAND memory device, the substrate is preferably a silicon substrate.

The memory cell unit MCL and the peripheral circuit OSC are electrically connected to each other by wirings EW. The wirings EW functions as wirings electrically connecting the memory cells in the memory cell unit MCL and the peripheral circuit OSC. The wiring EW can be one or more kinds of wiring(s) selected from a bit line (e.g., write bit line, read bit line), a word line, a voltage line that supplies a constant voltage, and the like; the kind and the number of wiring(s) can be decided depending on the circuit structure of the memory cells.

Since the peripheral circuit OSC overlaps the memory cell unit MCL, the memory cell unit MCL and the peripheral circuit OSC can be manufactured by different processes. Specifically, transistors included in the memory cell unit MCL and transistors included in the peripheral circuit OSC can be different. For example, when the memory cell unit MCL includes a three-dimensional NAND memory device, the NAND memory device can include transistors including silicon in their channel formation regions (hereinafter referred to as Si transistors) and the peripheral circuit OSC controlling the NAND memory device can include OS transistors including a metal oxide in their channel formation regions. In particular, an OS transistor has a lower formation temperature than a Si transistor; when the peripheral circuit OSC is formed as a single-polarity circuit composed of OS transistors, heat effect on the Si transistors included in the memory cell unit MCL can be reduced. In addition, since the peripheral circuit OSC overlaps the memory cell unit MCL, an increase in the circuit area of the semiconductor device can be suppressed. In addition, the data transfer distance between the memory cell unit MCL and the peripheral circuit OSC becomes short, which suppresses an increase in power consumption.

Figure 1B:
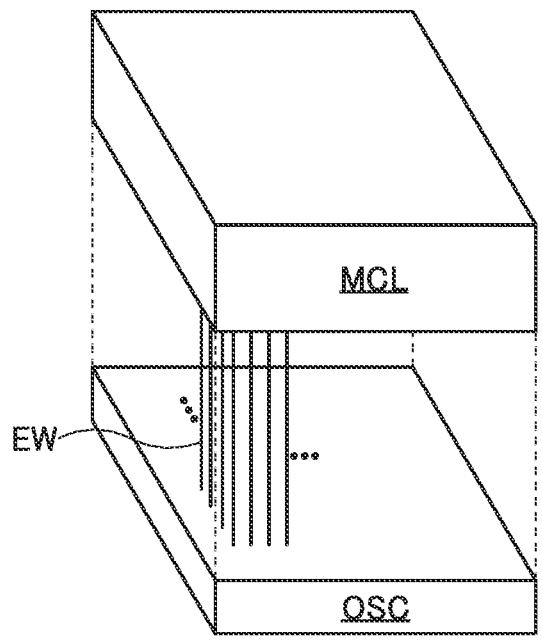

The semiconductor device of one embodiment of the present invention may have a structure in which the memory cell unit MCL overlaps the peripheral circuit OSC, as shown in FIG. 1B.

Figure 1C:
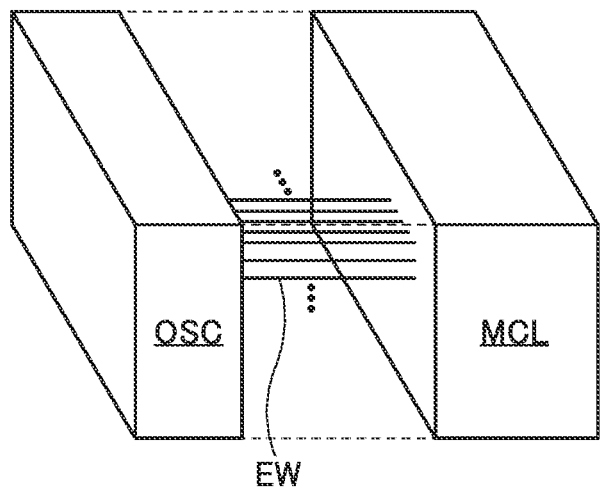

The semiconductor device of one embodiment of the present invention may have a structure in which the memory cell unit MCL and the peripheral circuit OSC are included in the same layer or the memory cell unit MCL and the peripheral circuit OSC are level with each other, as shown in FIG. 1C.

Next, structures of the cell unit MCL and the peripheral circuit OSC are described.

Figure 2A:
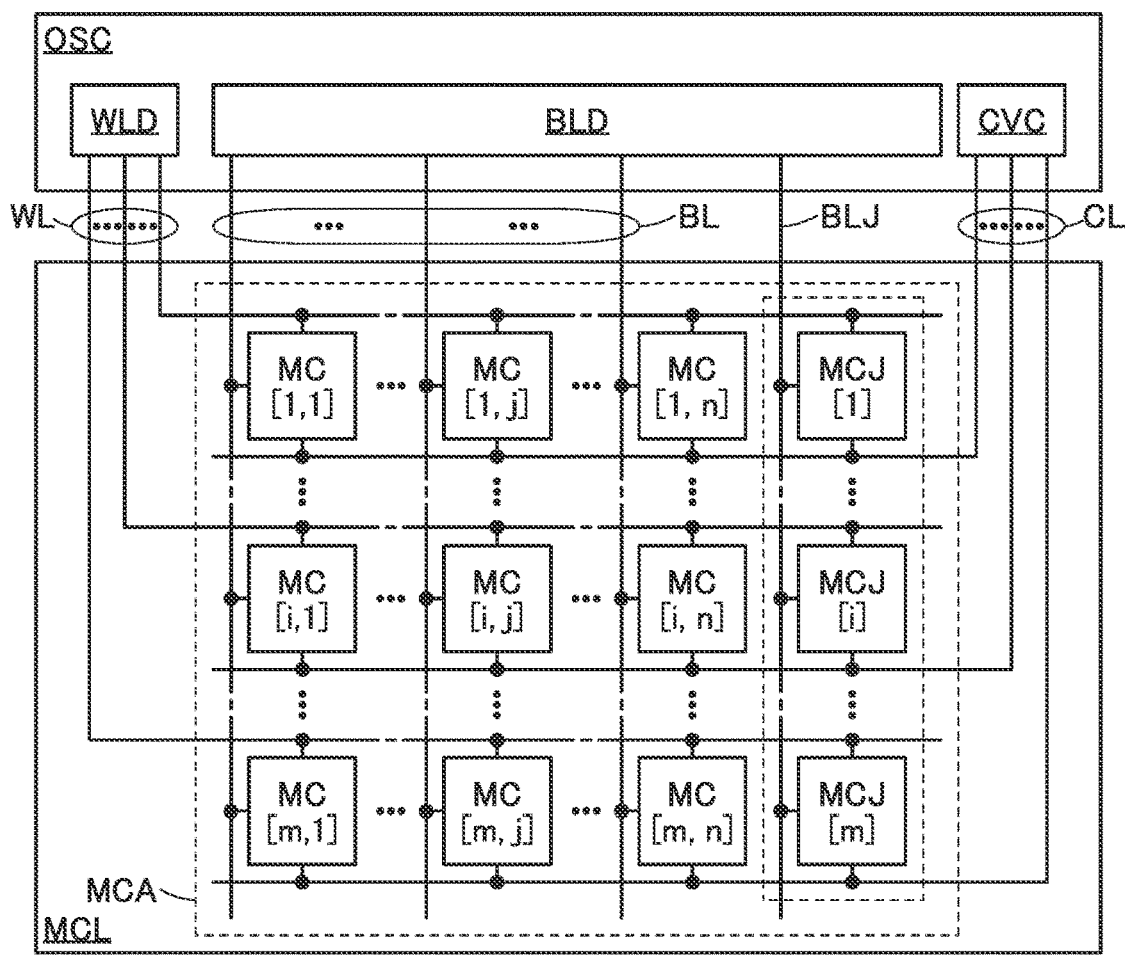

FIG. 2A shows an example of the memory cell unit MCL and the peripheral circuit OSC included in the semiconductor device shown in FIG. 1A.

The memory cell unit MCL includes a memory cell array MCA. The memory cell array MCA includes memory cells MC and redundant memory cells MCJ, and the memory cells MC are arranged in a matrix. The memory cell array MCA in FIG. 2A includes m memory cells in one column and n memory cells in one row, that is, m×n memory cells MC. The memory cell MC which is positioned at i-th column and j-th row (i is an integer within the range of 1 to m, and j is an integer within the range of 1 to n) is represented as a memory cell MC[i, j] in FIG. 2A. FIG. 2A only shows a memory cell MC[1, 1], a memory cell MC[i, 1], a memory cell MC[m, 1], a memory cell MC[1, j], the memory cell MC[i, j], a memory cell MC[m, j], a memory cell MC[1, n], a memory cell MC[j, n], a memory cell MC[m, n], and other memory cells MC are not shown. One more column of redundant memory cells MCJ is disposed in the matrix in FIG. 2A. Thus, the memory cell array MCA in FIG. 2A includes m redundant memory cells MCJ; only a redundant memory cell MCJ[1], a redundant memory cell MCJ[i], and a redundant memory cell MCJ[m] are shown in FIG. 2A. One column of redundant memory cells MCJ is disposed in the matrix in FIG. 2A; two or more columns of them may be disposed as well.

Wirings WL, wirings BL, a wiring BLJ, and wirings CL shown in FIG. 2A correspond to the wirings EW shown in FIG. 1A. The wirings WL are word lines, and the wirings WL are each electrically connected to memory cells MC and a redundant memory cell MCJ row by row of the matrix. The wirings BL are bit lines, and the wirings BL are each electrically connected to memory cells MC column by column of the matrix. The wiring BLJ is a bit line of the redundant memory cells MCJ, and electrically connected to the redundant memory cells MCJ in a column. When two or more columns of the redundant memory cells MCJ are disposed, a plurality of wirings BLJ may be provided. The wirings CL are voltage lines; the wirings CL are each electrically connected to the memory cells MC and the redundant memory cell MCJ row by row of the matrix.

The wirings WL, the wirings BL, the wiring BLJ, and the wirings CL shown in the semiconductor device of FIG. 2A are an example; depending on the structure of the memory cells MC and the redundant memory cells MCJ, types of wirings are decided. The wiring BL in FIG. 2A is shown as a bit line, but the bit line may be two bit lines of a write bit line and a read bit line, for example. When the memory cells MC and the redundant memory cells MCJ are SRAMs (Static Random Access Memory), the wiring BL can be two wirings for transfer: one for a digital signal to write data and the other for an inverted signal of the signal. Embodiment 2 shows the case where the memory cells MC and the redundant memory cells MCJ are SRAMs. Furthermore, one wiring WL is electrically connected to one memory cell MC (one redundant memory cell MCJ) in FIG. 2A; two or more wirings WL can be electrically connected to one memory cell MC (one redundant memory cell MCJ), for example. Furthermore, one wiring CL is electrically connected to one memory cell MC (one redundant memory cell MCJ) in FIG. 2A; two or more wirings CL can be electrically connected to one memory cell MC (one redundant memory cell MCJ), for example.

The peripheral circuit OSC includes, for example, a circuit WLD, a circuit BLD, and a circuit CVC. The circuit WLD functions as a word line driver circuit and is electrically connected to the wirings WL. The circuit BLD functions as a bit line driver circuit and is electrically connected to the wirings BL and the wiring BLJ. The circuit CVC generates a constant voltage, functions as a voltage source which outputs the constant voltage, and is connected to the wirings CL. The circuit CVC is not necessarily included in the peripheral circuit OSC; the circuit CVC may be provided outside the semiconductor device, for example. In this case, the memory cell unit MCL of the semiconductor device is supplied with a constant voltage from the outside.

A circuit structure of the memory cells MC does not necessarily need a constant voltage from the wirings CL. In that case, the semiconductor device of one embodiment of the present invention may have a structure that does not include the wirings CL. That is, the peripheral circuit OSC may have a structure that does not include the circuit CVC.

Figure 2B:
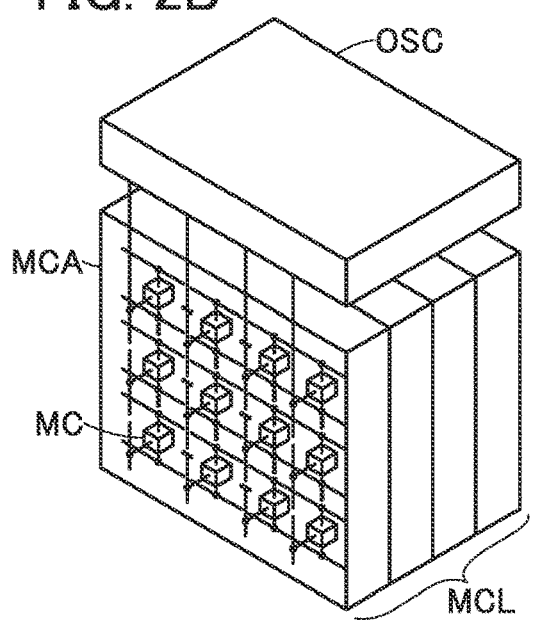
Figure 2C:
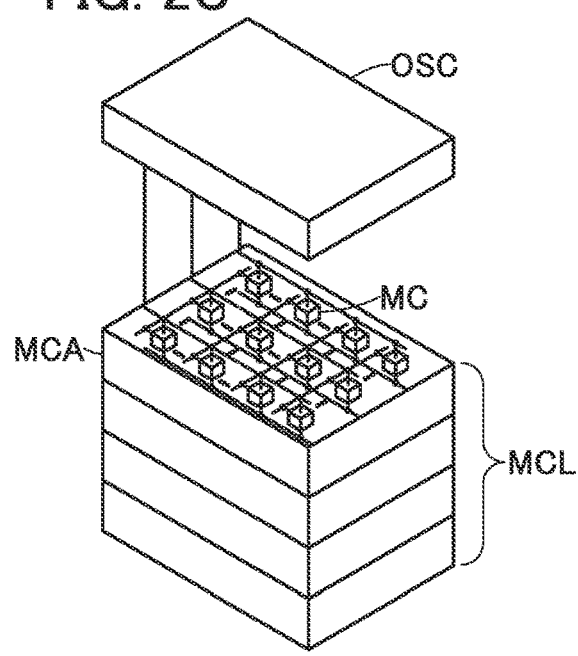

FIG. 2A shows that the memory cell unit MCL includes one memory cell array MCA, but one embodiment of the present invention is not limited thereto. For example, as shown in FIG. 2B, a plurality of memory cell arrays MCA may be formed to be in a row over a substrate in the memory cell unit MCL. Alternatively, for example, as shown in FIG. 2C, a plurality of memory cell arrays MCA may be stacked over a substrate in the memory cell unit MCL.

Next, structures of the memory cell unit MCL and the peripheral circuit OSC different from the semiconductor device shown in FIG. 2A are described.

Figure 3:
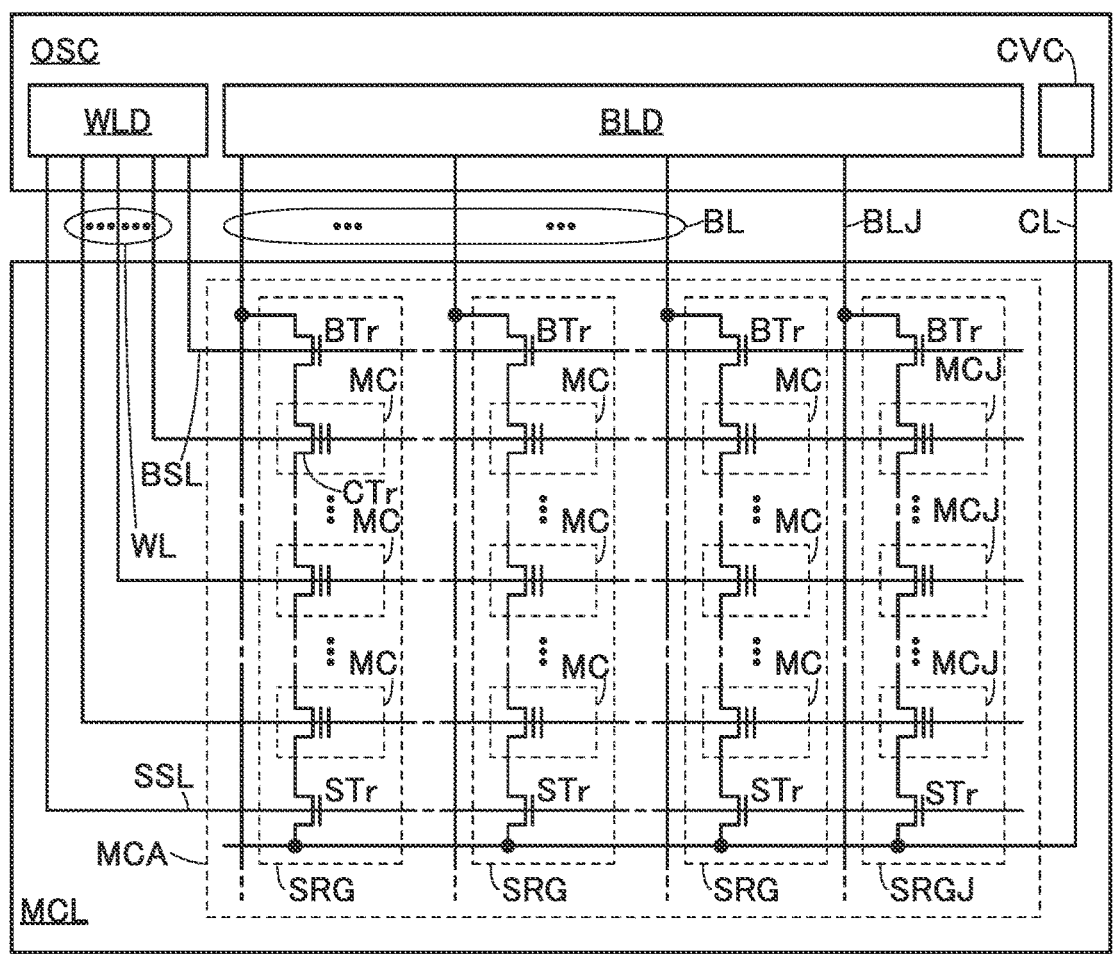
FIG. 3 is a block diagram showing a structure of a semiconductor device.

FIG. 3 shows a structure example where the memory cell unit MCL of FIG. 1A includes NAND memory devices.

The memory cell array MCA includes strings SRG and a string SRGJ. The strings SRG are electrically connected to the wirings BL and the string SRGJ is electrically connected to the wiring BLJ. Each string includes transistors CTr electrically connected in series and a transistor BTr and a transistor STr as selector transistors. One transistor CTr functions as a cell transistor, which is included in the memory cells MC of the strings SRG or the redundant memory cells MCJ of the string SRGJ.

In general, a cell transistor is a transistor that operates with normally-on characteristics and includes a control gate and a charge accumulation layer. The charge accumulation layer is provided in a region overlapping a channel formation region with a tunnel insulating film therebetween, and the control gate is provided in a region overlapping the charge accumulation layer with a blocking film therebetween. In the cell transistor, a tunnel current occurs when a write potential is applied to the control gate and a predetermined potential is supplied to the first terminal or the second terminal of the cell transistor; hence, electrons are injected from the channel formation region into the charge accumulation layer of the cell transistor. Thus, the threshold voltage of a cell transistor in which electrons are injected into its charge accumulation layer is increased. Note that a floating gate may be used instead of the charge accumulation layer.

A channel formation region of the transistor BTr, the transistor CTr, and the transistor STr preferably contain any one or more materials selected from, for example, silicon, germanium, gallium arsenide, silicon carbide (SiC), and a metal oxide that will be described in Embodiment 3. Particularly in the case where the channel formation region contains a metal oxide of any one or more selected from indium, an element M (e.g., aluminum, gallium, yttrium, or tin can be given as the element M), and zinc, the metal oxide sometimes functions as a wide gap semiconductor; thus, the transistor BTr, the transistor CTr, and the transistor STr containing the metal oxide in these channel formation regions have ultralow off-state current characteristics. That is, the leakage current of the transistor BTr, the transistor CTr, and the transistor STr in the off state can be reduced, so that power consumption of the semiconductor device can be reduced in some cases.

Next, a connection structure of the strings SRG electrically connected to the wirings BL is described. The first terminal of the transistor BTr is electrically connected to the wiring BL, and the first terminal of the transistor STr is electrically connected to the wiring CL. One end of the transistors CTr electrically connected in series is electrically connected to the second terminal of the transistor BTr, and the other end of the transistors CTr electrically connected in series is electrically connected to the second terminal of the transistor STr.

The string SRGJ electrically connected to the wiring BLJ includes, like the strings electrically connected to the wirings BL, the transistors CTr electrically connected in series and the transistor BTr and the transistor STr as selector transistors.

A wiring BSL and a wiring SSL function as wirings for selecting a string on which writing, reading, or erasing is performed. The wiring BSL is electrically connected to the gates of the transistors BTr included in the memory cell unit MCL, and the wiring SSL is electrically connected to the gates of the transistors STr included in the memory cell unit MCL.

In FIG. 3, in the memory cell unit MCL, one wiring BL is electrically connected to one string SRG, and the wiring BLJ is electrically connected to one string SRGJ, however, one embodiment of the present invention is not limited thereto. For example, as shown in FIG. 4, one wiring BL may be electrically connected to strings SRG and the wiring BLJ may be electrically connected to strings SRGJ in the memory cell unit MCL.

Figure 4:
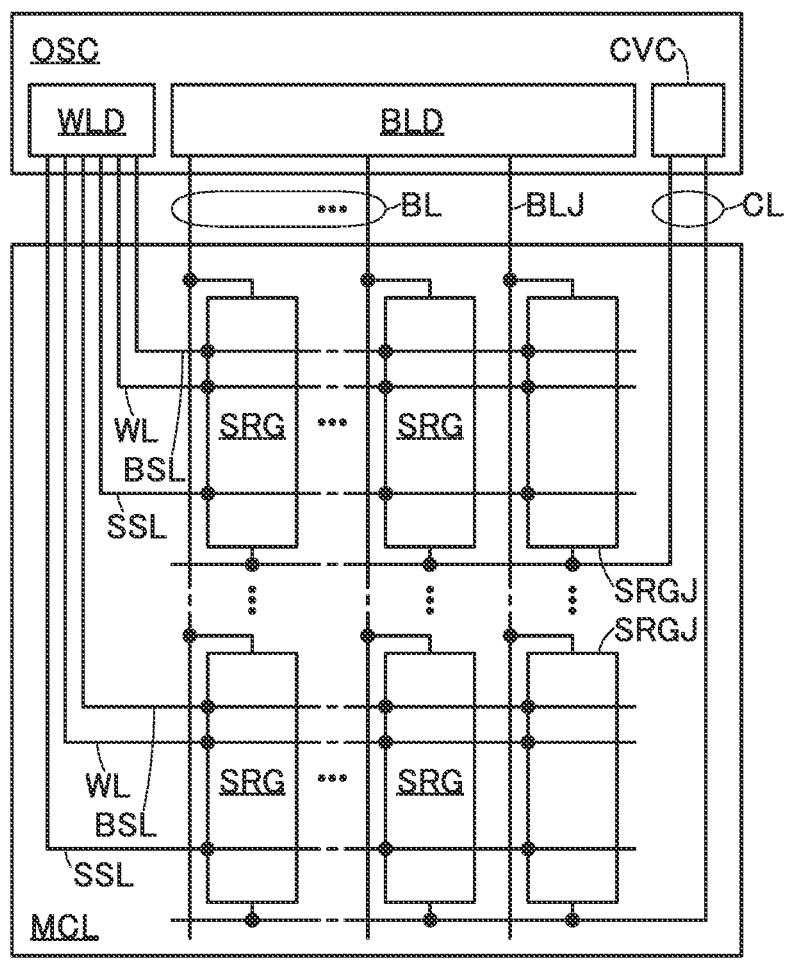
FIG. 4 is a block diagram showing a structure of a semiconductor device.
Figure 5:
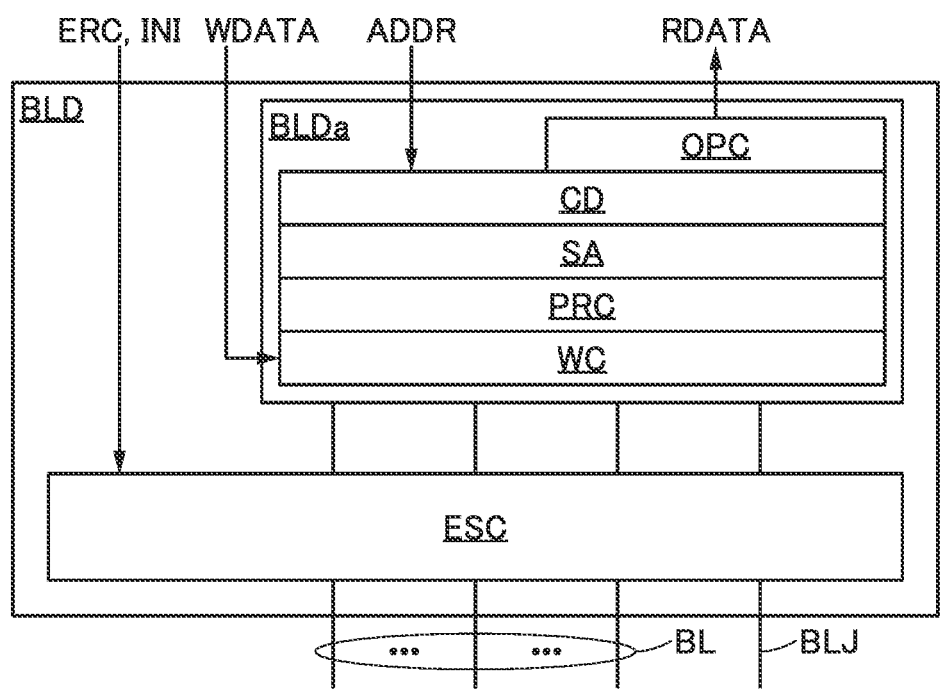
FIG. 5 is a block diagram showing a circuit included in a semiconductor device.

Here, details of the circuit BLD shown in FIG. 2 to FIG. 4 are described. FIG. 5 shows an example of the circuit BLD included in the semiconductor device of one embodiment of the present invention, and the circuit BLD includes a circuit BLDa and a circuit ESC.

The circuit BLDa has a function of sending a data signal WDATA to the wirings BL or the wiring BLJ to write it to the memory cells MC or the redundant memory cells MCJ, and a function of appropriately processing the data read out from the memory cells MC or the redundant memory cells MCJ to output it as a data signal RDATA.

For example, the circuit BLDa may include a write circuit WC, a precharge circuit PRC, a sense amplifier SA, a column decoder CD, and an output circuit OPC.

The column decoder CD has a function of selecting the wiring BL which has a target memory cell MC of writing or reading in accordance with an address signal ADDR obtained from the outside. The column decoder CD may have a function of selecting the wiring BLJ including the redundant memory cell MCJ when the memory cell MC is a defective cell. The write circuit WC has a function of sending the data signal WDATA to the wiring BL (or wiring BLJ depending on cases) selected by the column decoder CD.

The precharge circuit PRC has a function of precharging the wirings BL and the wiring BLJ with a constant voltage. The sense amplifier SA has a function of amplifying a data signal read out from the wiring BL and the wiring BLJ. The amplified data signal is output to the outside as the data signal RDATA through the output circuit OPC.

The circuit ESC has a function of, when a defective cell is found in the memory cell unit MCL, stopping writing operation or a reading operation in the column including the defective cell, and performing a writing operation or a reading operation on the redundant memory cell MCJ instead of the defective cell. The circuit ESC receives a signal ERC having address data of the defective cell position from the outside to switch between a conduction state and a non-conduction state between the wirings BL and the circuit BLDa, and to switch between a conduction state and a non-conduction state between the wiring BLJ and the circuit BLDa, according to the signal ERC.

When writing is not performed on the redundant memory cells MCJ (no defective cells are found in the memory cell unit MCL), the wirings BL and the circuit BLDa are brought into a conduction state and the wiring BLJ and the circuit BLDa are brought into a non-conduction state. In order to make the circuit ESC operate in this manner, for example, a signal INI may be sent to the circuit ESC as an ordering signal.

STRUCTURE EXAMPLE 1 OF CIRCUIT ESC

Figure 6A:
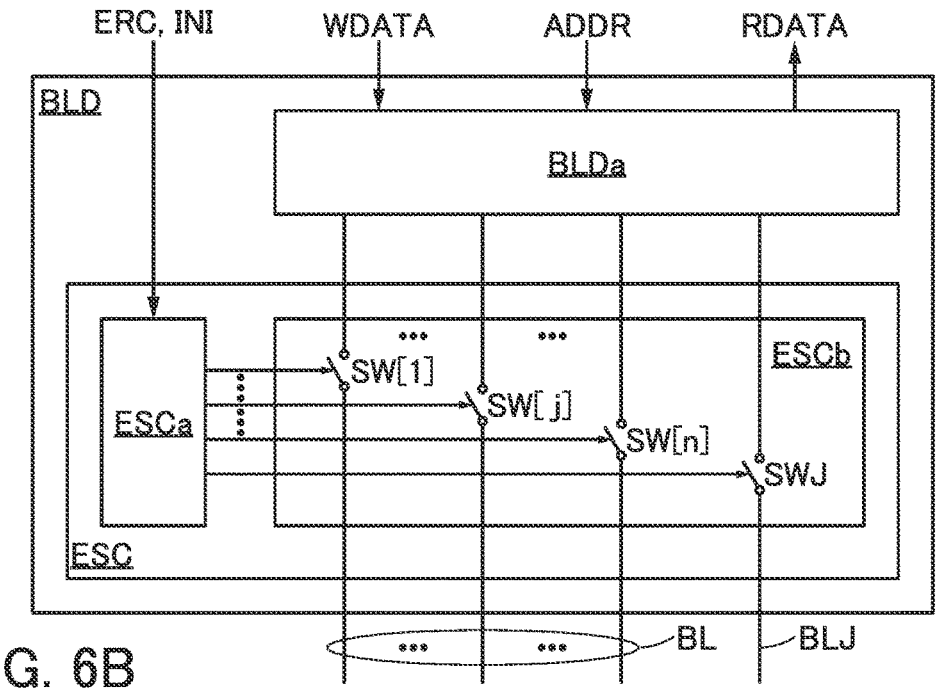
FIG. 6A, FIG. 6B, FIG. 6C, and FIG. 6D are block diagrams showing a circuit included in a semiconductor device.

FIG. 6A shows a specific example of a circuit structure of the circuit ESC. FIG. 6A shows, in addition to the circuit ESC, the circuit BLDa to show the electrical connection to the circuit ESC.

The circuit ESC includes a circuit ESCa and a circuit ESCb. The circuit ESCb includes a switch SW[1] to a switch SW[n] and a switch SWJ. Here, n is an integer of 1 or more, and the number of columns of the memory cells MC arranged in a matrix in the memory cell array MCA. Note that FIG. 6A shows a switch SW[j], and j is an integer within the range of 1 to n.

As the switch SW[1] to the switch SW[n] and the switch SWJ, an electrical switch or a mechanical switch can be used, for example. That is, a switch can be any element capable of controlling current, and is not limited to a certain element. Examples of an electrical switch include a transistor (e.g., bipolar transistor and MOS transistor), a diode (e.g., PN diode, PIN diode, Schottky diode, MIM (Metal Insulator Metal) diode, MIS (Metal Insulator Semiconductor) diode, and diode-connected transistor), and a logic circuit in which such elements are combined (e.g., analog switch). An example of a mechanical switch is a switch formed using a MEMS (micro electro mechanical system)

technology, such as a digital micromirror device (DMD). Such a switch includes an electrode that can be moved mechanically, and operates by controlling conduction and non-conduction with movement of the electrode.

Figure 6B:
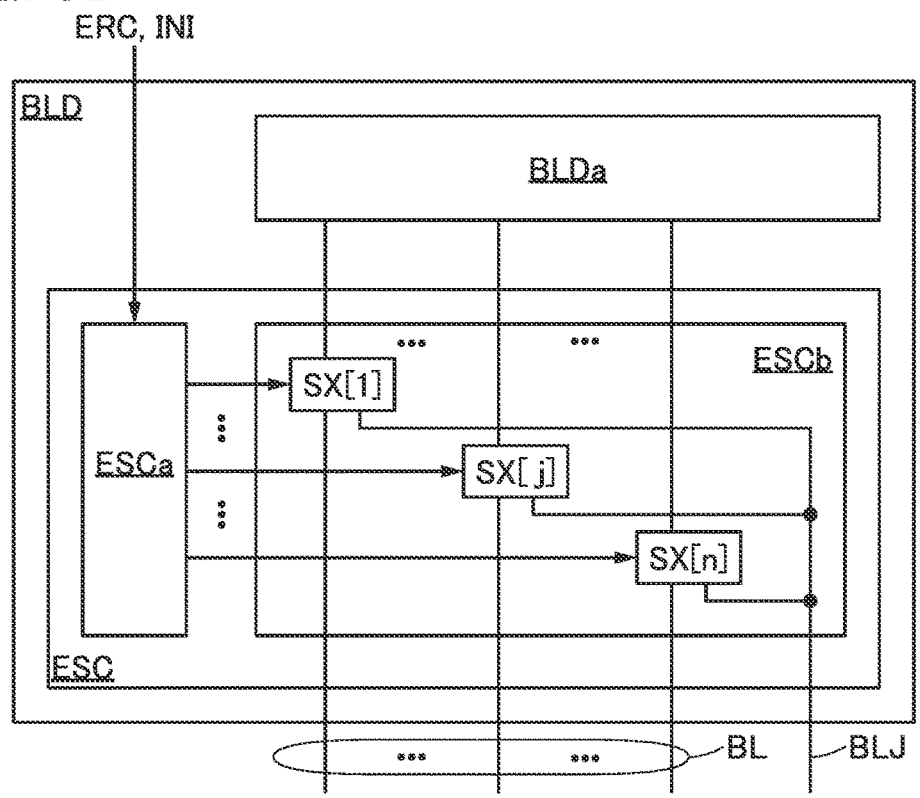
Figure 6C:
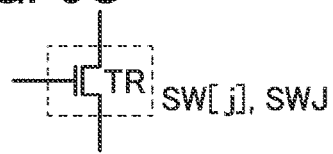

The switch SW[1] to the switch SW[n] and the switch SWJ in this embodiment are n-channel type transistors TR shown in FIG. 6C as an example. The first terminal of the transistor TR is electrically connected to the first terminal of the switch SW[j], the second terminal of the transistor TR is electrically connected to the second terminal of the switch SW[j], and the gate of the transistor TR is electrically connected to the control terminal of the switch SW[j]. Each of the switch SW[1] to the switch SW[n] and the switch SWJ is brought to be the on state when a high-level potential is applied to their control terminals, and is turned off when a low-level potential is applied to their control terminals. The channel formation regions of the transistors preferably contain a metal oxide described in Embodiment 3. When a transistor has a metal oxide in its channel formation region, the transistor has an extremely low off-state current, which can reduce power consumption due to a leak current at the off state of the transistor.

Each control terminal of the switch SW[1] to the switch SW[n] and the switch SWJ is electrically connected to the circuit ESCa. The first terminals of the switch SW[1] to the switch SW[n] and the first terminal of the switch SWJ are electrically connected to the circuit BLDa. The second terminals of the switch SW[1] to the switch SW[n] are electrically connected to the wirings BL, and the second terminal of the switch SWJ is electrically connected to the wiring BLJ.

The circuit ESCa has a function of supplying a high-level potential or a low-level potential to the control terminals of the switch SW[1] to the switch SW[n] and the switch SWJ. Specifically, when a defective cell is found in the memory cell MC, in order to bring the wiring BL in the column including the memory cell MC and the circuit BLDa into a non-conduction state, the circuit ESCa applies a low-level potential to the control terminal of the corresponding switch in the switch SW[1] to the switch SW[n]. In order to bring the wiring BLJ in the column including the redundant memory cell MCJ instead of the defective cell and the circuit BLDa into a conduction state, the circuit ESCa applies a high-level potential to the control terminal of the switch SWJ.

<Operation Method 1>

Figure 8A:
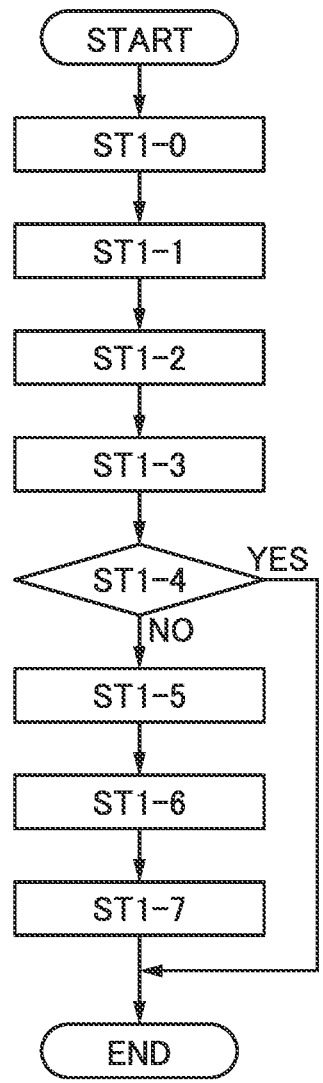
FIG. 8A and FIG. 8B are flow charts showing operation examples of a semiconductor device.

Here, an example of an operation method of the semiconductor device including the circuit BLD shown in FIG. 6A is described. The flow chart shown in FIG. 8A shows an example of a method of a data writing operation of the semiconductor device including the circuit BLD shown in FIG. 6A. The flow chart of FIG. 8A shows "START" which shows the start of the operation and "END" which shows the end of the operation.

[Step ST1-0]

First, a signal INI is input to the circuit ESC. Receiving the signal INI, the circuit ESC brings the switch SW[1] to the switch SW[n] into the on state and the switch SWJ into the off state. Specifically, the signal INI is sent to the circuit ESCa and the circuit ESCa applies a high-level potential to each control terminal of the switch SW[1] to the switch SW[n] and a low-level potential to the control terminal of the switch SWJ.

[Step ST1-1]

The data signal WDATA and the address signal ADDR are input to the circuit BLD included in the peripheral circuit OSC of the semiconductor device.

[Step ST1-2]

Next, the column decoder CD included in the circuit BLD selects the wiring BL in the column which includes the memory cell MC to which the data signal WDATA is written, according to the address signal ADDR. At this time, the circuit WLD selects the wiring WL which is electrically connected to the memory cell MC to which the data signal WDATA is written.

[Step ST1-3]

The circuit BLDa sends the data signal WDATA to the selected wiring BL and writes data to the memory cell MC according to the address signal ADDR. An amplifier circuit, a potential level converter circuit, or the like can be provided in the circuit BLDa to appropriately change the potential of the data signal WDATA sent to the wiring BL.

[Step ST1-4]

After the signal WDATA is written to the memory cell MC, the written data is read out from the memory cell MC, and the correspondence between the written data and the read data is judged. Specifically, the data read from the memory cell MC is sent to the circuit BLD as the data signal RDATA and error is checked. When the read data is different from the written data, the memory cell MC is determined as a defective cell.

As an error check, for example, a parity check, a checksum, a cyclic code, or the like can be used, for example. Alternatively, the data of the data signal WDATA used for writing and the data of the data signal RDATA used for reading may be compared for the determination. In this case, the data signal WDATA is written to another memory device that is different from the memory cell unit MCL, and then the written data is read out from the memory cell MC as the data signal RDATA to be compared with the data written in the memory device.

When the data written to the memory cell MC corresponds to the read data ("YES" in STEP ST1-4 of FIG. 8A) in an error check, the writing operation finishes. When the data written to the memory cell MC does not correspond to the read data ("NO" in STEP ST1-4 of FIG. 8A), the operation moves to STEP ST1-5.

[Step ST1-5]

Once the memory cell MC to which the data signal WDATA has been written is determined as a defective cell in STEP ST1-4, a signal ERC which includes the result is input to the circuit ESCa in STEP ST1-5. The signal ERC includes the address of the defective memory cell MC; the circuit ESCa applies, according to the signal ERC, a high-level potential or a low-level potential to each control terminal of the switch SW[1] to the switch SW[n] to bring the wiring BL which includes no defective cell and the circuit BLDa into a conduction state, and the wiring BL which includes the defective cell and the circuit BLDa into a non-conduction state. When a defect cell is included in the memory cell array MCA, the circuit ESCa applies a high-level potential to the control terminal of the switch SWJ to bring the wiring BLJ and the circuit BLDa into a conduction state.

[Step ST1-6]

Next, the column decoder CD selects, according to the address signal ADDR, the wiring BLJ in the column which includes the memory cell MCJ to which the data signal WDATA is written. Note that the address signal ADDR which is sent to the circuit BLDa in STEP ST1-6 is different from the address signal ADDR which is sent in STEP ST1-2, since the data signal WDATA is written to a different address from that in STEP ST1-2.

At this time, the wiring WL which is electrically connected to the memory cell MC to which the data signal WDATA is written is selected by the circuit WLD. The wiring WL selected in STEP ST1-6 can be the same as or different from the wiring WL selected in STEP ST1-2.

[Step ST1-7]

The circuit BLDa sends the data signal WDATA to the selected wiring BLJ and writes data to the redundant memory cell MCJ. Thus, the writing operation finishes.

Note that FIG. 2 shows the memory cell unit MCL including only one column of the redundant memory cells MCJ, and can have two or more columns depending on cases as described above. Depending on the number of the wirings BLJ (the number of columns of the redundant memory cells MCJ) of the circuit ESC in FIG. 6A, switches SWJ can be provided.

STRUCTURE EXAMPLE 2 OF CIRCUIT ESC

Next, as a different example of FIG. 6A, a specific circuit structure example of the circuit ESC is shown in FIG. 6B. As in FIG. 6A, FIG. 6B shows, in addition to the circuit ESC, the circuit BLDa to show the electrical connection to the circuit ESC.

The circuit ESC includes the circuit ESCa and the circuit ESCb, and the circuit ESCb includes switches SX[1] to SX[n]. The switch SX[1] to the switch SX[n] include the first terminal to the third terminal and the control terminal, and have a function of bringing the first terminal and one of the second terminal and the third terminal into a conduction state, or a function of bringing the other of the first terminal and the second terminal and the third terminal into a non-conduction state according to the voltage input to the control terminal. For example, in the switch SX[1] to the switch SX[n], when a high-level potential is applied to the control terminals of the switch SX[1] to the switch SX[n], the first terminal and the second terminal are brought into a conduction state, and the first terminal and the third terminal are brought into a non-conduction state. For example, in the switch SX[1] to the switch SX[n], when a low-level potential is applied to the control terminals of the switch SX[1] to the switch SX[n], the first terminal and the third terminal are brought into a conduction state, and the first terminal and the second terminal are brought into a non-conduction state.

Figure 6D:
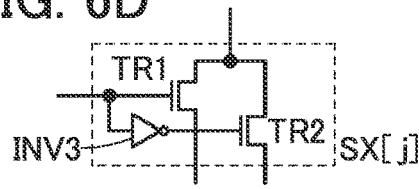

Each of the switch SX[1] to the switch SX[n] can have a structure shown in FIG. 6D, for example. In FIG. 6D, the switch SX[j] includes a transistor TR1, a transistor TR2, and a logic circuit INV3. The logic circuit INV3 has a function of outputting an inverted signal of a signal input to the input terminal to the output terminal, i.e., an inverter circuit. The first terminal of the switch SX[j] is electrically connected to the first terminal of the transistor TR1 and the first terminal of the transistor TR2, the second terminal of the switch SX[j] is electrically connected to the second terminal of the transistor TR1, and the third terminal of the switch SX[j] is electrically connected to the second terminal of the transistor TR2. The control terminal of the switch SX[j] is electrically connected to the gate of the transistor TR1 and the input terminal of the logic circuit INV3, and the output terminal of the logic circuit INV3 is electrically connected to the gate of the transistor TR2. This structure can bring the first terminal and one of the second terminal and the third terminal into a conduction state, and bring the first terminal and the other of the second terminal and the third terminal into a non-conduction state, according to the voltage input to the control terminal. Like the transistor TR, the transistor TR1 and the transistor TR2 preferably include an oxide semiconductor in their channel formation regions. The structure of the switch SX[j] shown in FIG. 6D is an example, and the structure of the switch SX[j] can be changed in accordance with the peripheral circuit structure.

The first terminals of the switch SX[1] to the switch SX[n] are electrically connected to the circuit BLDa, the second terminals of the switch SX[1] to the switch SX[n] are electrically connected to the wirings BL, and the third terminals of the switch SX[1] to the switch SX[n] are electrically connected to the wiring BLJ.

Like the circuit ESC in FIG. 6A, the circuit ESC in FIG. 6B receives the signal ERC which includes the result of the defective cell determination of the memory cell MC, thereby applies, according to the signal ERC, a high-level potential or a low-level potential to each control terminal of the switch SX[1] to the switch SX[n]. For example, when the memory cell MC in the j-th column is a defective cell, the circuit ESC applies a low-level potential to the control terminal of the switch SX[j] to bring the wiring BL in the j-th column and the circuit BLD into a non-conduction state. In contrast, the first terminal and the third terminal of the switch SX[j] are brought into a conduction state, whereby the circuit BLDa and the wiring BLJ are brought into a conduction state.

When writing is not performed on the redundant memory cells MCJ (no defective cells are found in the memory cell unit MCL), the wirings BL and the circuit BLDa are brought into a conduction state and the wiring BLJ and the circuit BLDa are brought into a non-conduction state. In order to make the circuit ESC operate in this manner, for example, a signal INI may be sent to the circuit ESC as an ordering signal.

The circuit ESC in FIG. 6B is preferable when a memory cell MC in one column among the first column to the n-th column is a defective cell.

<Operation Method 2>

Figure 8B:
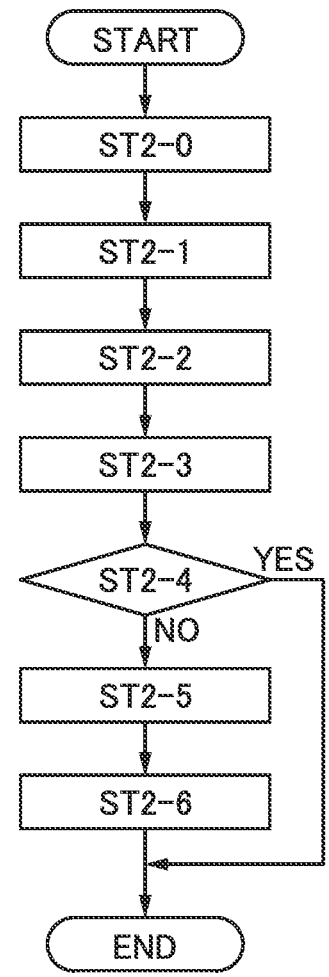

Next, an operation method of the semiconductor device including the circuit BLD shown in FIG. 6B is described. The flow chart shown in FIG. 8B shows an example of a data writing operation in the semiconductor device including the circuit BLD shown in FIG. 6B. The same description for the circuit BLD in FIG. 6A and the operation example of the flow chart in FIG. 8A can be omitted.

[Step ST2-0]

In STEP ST2-0, as in Step ST1-0 in FIG. 8A, the signal INI is input to the circuit ESC. Specifically, in the case of the circuit BLD in FIG. 6B, the circuit ESC receives the signal INI and the circuit ESCa applies a high-level potential to each control terminal of the switch SX[1] to the switch SX[n], whereby the wirings BL are electrically connected to the circuit BLDa through the switch SX[1] to the switch SX[n].

[Step ST2-1 to Step ST2-4]

Since STEP ST2-1 to STEP ST2-4 are the same operations as STEP ST1-1 to STEP ST1-4, the descriptions of STEP ST1-1 to STEP ST1-4 are referred to.

When the data written to the memory cell MC corresponds to the read data ("YES" in STEP ST2-4 of FIG. 8B) in an error check, the writing operation finishes. When the data written to the memory cell MC does not correspond to the read data ("NO" in STEP ST2-4 of FIG. 8B), the operation moves to STEP ST2-5.

[Step ST2-5]

Once the memory cell MC to which the data signal WDATA has been written is determined as a defective cell in STEP ST2-4, a signal ERC which includes the result is input to the circuit ESCa in STEP ST2-5. The signal ERC includes the address of the defective memory cell MC; the circuit ESCa applies, according to the signal ERC, a high-level potential or a low-level potential to each control terminal of the switch SX[1] to the switch SX[n] to bring the wiring BL which includes the defective cell and the circuit BLDa into a non-conduction state and the wiring BLJ, instead of the wiring BL of the column, and the circuit BLDa into a conduction state. Here, for example, the memory cell MC in the j-th column in the memory cell unit MCL is determined as a defective cell, a low-level potential is applied to the control terminal of the switch SX[j], and the first terminal and the third terminal of the switch SX[j] are brought into a conduction state.

[Step ST2-6]

Before STEP ST2-5, the column decoder CD selects the wiring BL in the column which includes the memory cell MC to which the data signal WDATA is written according to the address signal ADDR sent in STEP ST2-2. In STEP ST2-6, with the wiring BL selected by the column decoder CD, the circuit BLDa sends the data signal WDATA.

Since the first terminal and the third terminal of the switch SX[j] are brought into a conduction state in STEP ST2-5, the data signal WDATA sent from the circuit BLDa is not sent to the wiring BL in the j-th column but to the wiring BLJ electrically connected to the redundant memory cells MCJ. Thus, the writing operation of the circuit BLD in FIG. 6B finishes.

In the circuit BLD of FIG. 6A, once a defective cell is found in the memory cell unit MCL, the address signal ADDR needs to be changed so that the data signal WDATA is not written to the defective cell but to the redundant memory cell MCJ; in the circuit ESC in the circuit BLD of FIG. 6B, the writing address can be switched as described above from the wiring BL to the wiring BLJ with the use of the signal ERC and any one of the switch SX[1] to the switch SX[n], whereby the address signal ADDR need not be changed.

The operation methods of the structure examples in this embodiment are not limited to STEP ST1-0 to STEP ST1-7 in FIG. 8A and STEP ST2-0 to STEP ST2-6 in FIG. 8B. In this specification and the like, processing shown in the flow charts is classified according to functions and shown as independent steps. However, in actual processing or the like, it is difficult to separate processing shown in the flow charts for every function, and there are such a case where a plurality of steps are associated with one step and a case where one step is associated with a plurality of steps. Thus, the processing shown in the flow charts is not limited to each step described in the specification, and the steps can be exchanged as appropriate depending on circumstances. Specifically, in some cases, the order of steps can be changed, a step can be added or omitted, for example, depending on circumstances.

Figure 7:
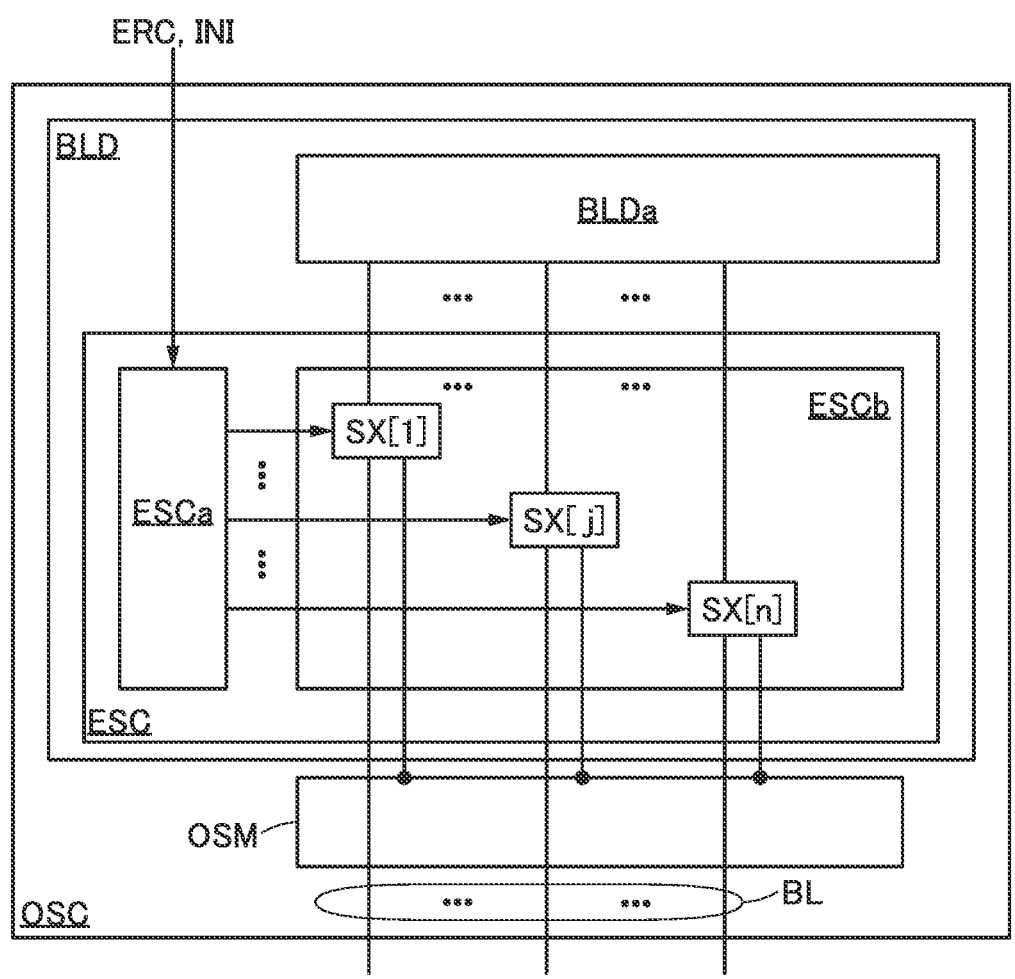
FIG. 7 is a block diagram showing a circuit included in a semiconductor device.

The semiconductor device of one embodiment of the present invention is not limited to the semiconductor devices shown in FIG. 2A to FIG. 2C, FIG. 3, and FIG. 4, and the semiconductor devices including the circuits shown in FIG. 5, FIG. 6A, and FIG. 6B. The semiconductor devices of one embodiment of the present invention shown in FIG. 2A to FIG. 2C, FIG. 3, and FIG. 4 and the semiconductor devices including the circuits shown in FIG. 5, FIG. 6A, and FIG. 6B can be appropriately changed. For example, the structure of the circuit BLD shown in FIG. 6A or FIG. 6B can be changed to the structure of the circuit BLD shown in FIG. 7. The circuit BLD in FIG. 7 has a structure in which a circuit OSM is electrically connected to the circuit BLD in FIG. 6A or FIG. 6B and the electrical connection to the wiring BLJ is omitted. FIG. 7 does not show the circuit WLD and the circuit CVC included in the peripheral circuit OSC. The circuit OSM is a circuit which can be provided in the peripheral circuit OSC and includes memory cells for retaining data, for example. When there is a defective cell in the memory cell unit MCL, the circuit BLD in FIG. 7 writes data to a memory cell included in the circuit OSM instead of the defective cell. When the peripheral circuit OSC is formed as a single-polarity circuit, the circuit OSM can be formed by the same process as the transistors included in the circuit BLD or the like. FIG. 7 shows the circuit OSM provided outside the circuit BLD; the circuit OSM can be included in the circuit BLD. FIG. 7 shows the circuit BLD with no electrical connection with the wiring BLJ; thus, the memory cell unit MCL electrically connected to the circuit BLD in FIG. 7 does not necessarily have the redundant memory cells MCJ.

Note that this embodiment can be combined with any of the other embodiments in this specification as appropriate.

Embodiment 2

In this embodiment, structure examples of the memory cell MC and the redundant memory cell MCJ included in the memory cell unit MCL described in Embodiment 1 are described.

STRUCTURE EXAMPLE 1

Figure 9A:
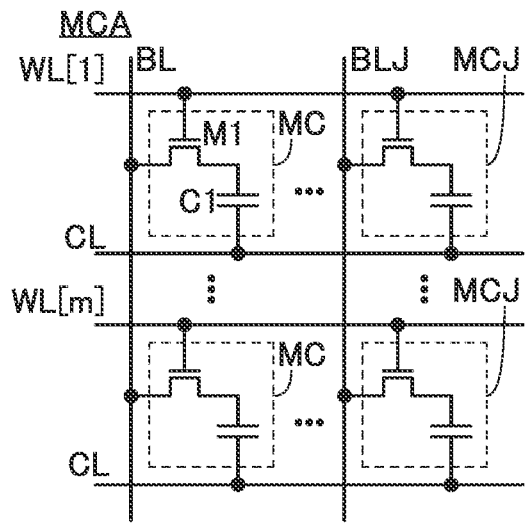
FIG. 9A, FIG. 9B, FIG. 9C, FIG. 9D, and FIG. 9E are block diagrams showing circuits included in a semiconductor device.

FIG. 9A shows a structure example of the memory cell array MCA using DRAMs (Dynamic Random Access Memory).

In the memory cell array MCA in FIG. 9A, each of the memory cells MC and the redundant memory cells MCJ includes a transistor M1 and a capacitor C1.

In the memory cell MC, the first terminal of the transistor M1 is electrically connected to the wiring BL, the second terminal of the transistor M1 is electrically connected to the first terminal of the capacitor C1, and the gate of the transistor M1 is electrically connected to one of the wirings WL. The second terminal of the capacitor C1 is electrically connected to the wiring CL.

In the redundant memory cell MCJ, the first terminal of the transistor M1 is electrically connected to the wiring BLJ, the second terminal of the transistor M1 is electrically connected to the first terminal of the capacitor C1, and the gate of the transistor M1 is electrically connected to one of the wirings WL. The second terminal of the capacitor C1 is electrically connected to the wiring CL.

A constant potential input to the wirings CL can be, for example, a low-level potential or a ground potential.

The transistors M1 of the memory cell array MCA in FIG. 9A are n-channel transistors, but can be p-channel transistors. Not only the memory cell array MCA in FIG. 9A, but the n-channel transistors shown in this specification and the like can be replaced with p-channel transistors in some cases. Oppositely, the p-channel transistors shown in this specification and the like can be replaced with n-channel transistors in some cases.

As well as the transistors M1 included in the memory cell array MCA in FIG. 9A, the transistors described in this specification and the like can be Si transistors, whose channel formation regions include silicon. As silicon, for example, hydrogenated amorphous silicon, microcrystalline silicon, polycrystalline silicon, or single crystal silicon can be used. The transistors described in this specification and the like can be OS transistors. Embodiment 3 describes an OS transistor. As transistors other than the OS transistor and the Si transistor, it is possible to use, for example, a transistor containing a semiconductor such as Ge in an active layer; a transistor containing a compound semiconductor such as ZnSe, CdS, GaAs, InP, GaN, or SiGe in an active layer; a transistor containing a carbon nanotube in an active layer; and a transistor containing an organic semiconductor in an active layer.

In particular, it is further preferable that a metal oxide in the channel formation region of an OS transistor be an oxide containing at least one of indium, an element M (examples of the element M include aluminum, gallium, yttrium, and tin), and zinc. The off-state current per micrometer of channel width of the OS transistor including the metal oxide in the channel formation region can be lower than or equal to 10 aA ($1\times10^{-17}$ A), preferably lower than or equal to 1 aA ($1\times10^{-18}$ A), further preferably lower than or equal to 10 zA ($1\times10^{-20}$ A), further preferably lower than or equal to 1 zA ($1\times10^{-21}$ A), further preferably lower than or equal to 100 yA ($1\times10^{-22}$ A). The OS transistor has a low carrier concentration of the metal oxide; when the temperature of the OS transistor changes, the off-state current keeps low. For example, even when the temperature of the OS transistor is 150° C., the off-state current per micrometer of channel width of the OS transistor can be 100 zA.

A DRAM using an OS transistor as the transistor M1 is sometimes referred to as a dynamic oxide semiconductor random access memory (DOSRAM).

STRUCTURE EXAMPLE 2

The memory cell array MCA is not limited to the circuit diagram shown in FIG. 9A, and can be appropriately changed. For example, as shown in FIG. 9B, the transistor M1 of the memory cell array MCA in FIG. 9A can include a back gate.

Figure 9B:
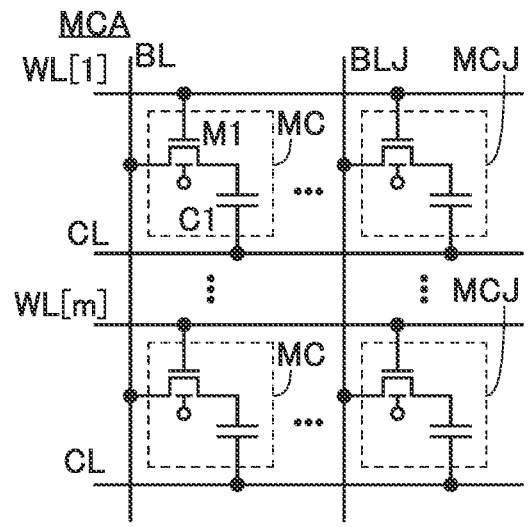

FIG. 9B does not show the electrical connection of the back gate of the transistor M1, but depending on desired operations or characteristics of the transistor M1, the target to which the back gate of the transistor M1 is connected can be decided. The back gate of the transistor M1 can be electrically connected to, for example, the gate of the transistor M1. When the gate and the back gate of the transistor M1 are electrically connected to each other, the amount of current flowing through the transistor M1 in the on state can be increased. For example, the back gate of the transistor M1 can be provided with a wiring for electrically connecting to an external circuit, and the threshold voltage of the transistor M1 can be increased by supply of a potential to the back gate of the transistor M1 from the external circuit. With such a structure, the off state current of the transistor M1 can be reduced owing to the external circuit.

The memory cell array MCA in FIG. 9B can use the above described OS transistor as the transistor M1 including the back gate, for example.

In this structure example, the transistor M1 of the memory cell array MCA in FIG. 9A is provided with the back gate, and the transistor in other structures can also be provided with the back gate. In other words, the transistors described in this specification and the like can be transistors including a back gate.

STRUCTURE EXAMPLE 3

Figure 9C:
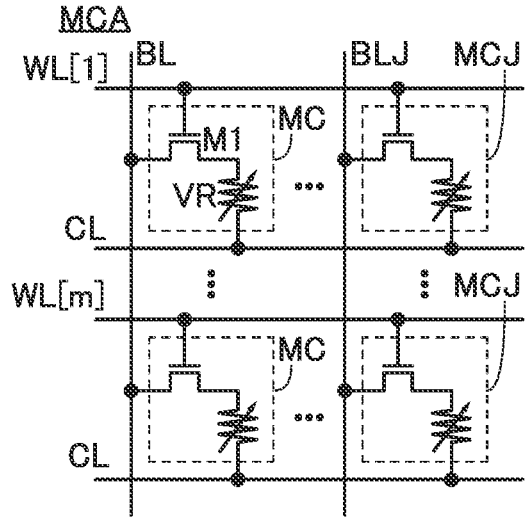

FIG. 9C shows a structure example of the memory cell array MCA using ReRAMs (Resistive Random Access Memory).

In the memory cell unit MCL in FIG. 9C, each of the memory cells MC and the redundant memory cells MCJ includes the transistor M1 and a variable resistor VR. The memory cell unit MCL shown in FIG. 9C uses the variable resistors VR instead of the capacitors C1 in the memory cell unit MCL in FIG. 9A.

STRUCTURE EXAMPLE 4

Figure 9D:
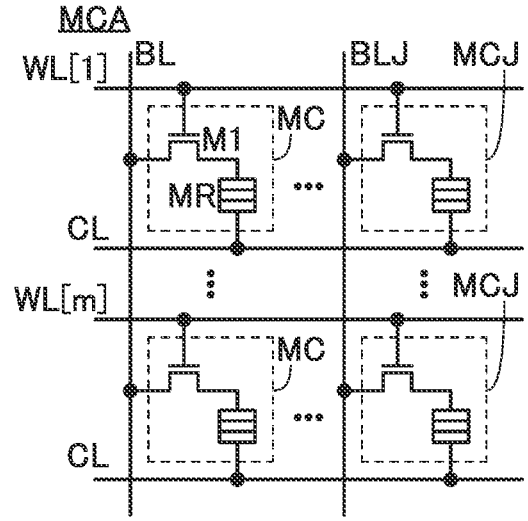

FIG. 9D shows a structure example of the memory cell array MCA using MRAMs (Magnetoresistive Random Access Memory).

In the memory cell unit MCL in FIG. 9D, each of the memory cells MC and the redundant memory cells MCJ includes the transistor M1 and a MTJ (Magnetic Tunnel Junction) element MR. The memory cell unit MCL shown in FIG. 9D uses the MTJ elements MR instead of the capacitors C1 in the memory cell unit MCL in FIG. 9A.

STRUCTURE EXAMPLE 5

Figure 9E:
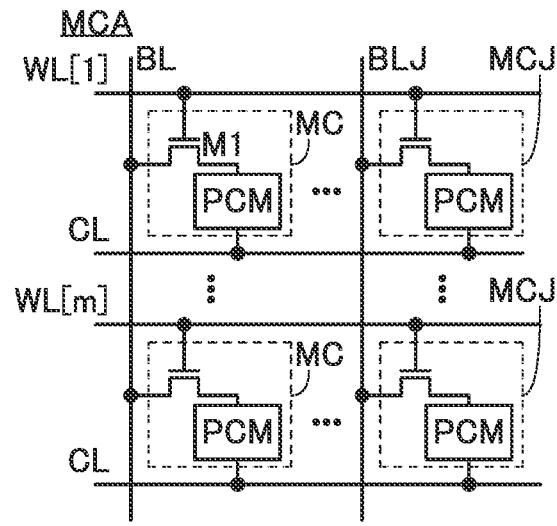

FIG. 9E shows a structure example of the memory cell array MCA using phase-change memories (a memory device including a phase-change memory is called PRAM in some cases).

In the memory cell unit MCL in FIG. 9E, each of the memory cells MC and the redundant memory cells MCJ includes the transistor M1 and a phase-change memory PCM. The memory cell unit MCL shown in FIG. 9C uses the phase-change memories PCM instead of the capacitors C1 in the memory cell unit MCL in FIG. 9A.

The phase-change memory PCM in a PRAM can be manufactured by replacing a dielectric material of the capacitor C1 used in a DRAM to a phase-change material in a manufacturing process. In other words, by using a DRAM manufacturing apparatus, a PRAM can be manufactured.

CONFIGURATION EXAMPLE 6

Figure 10A:
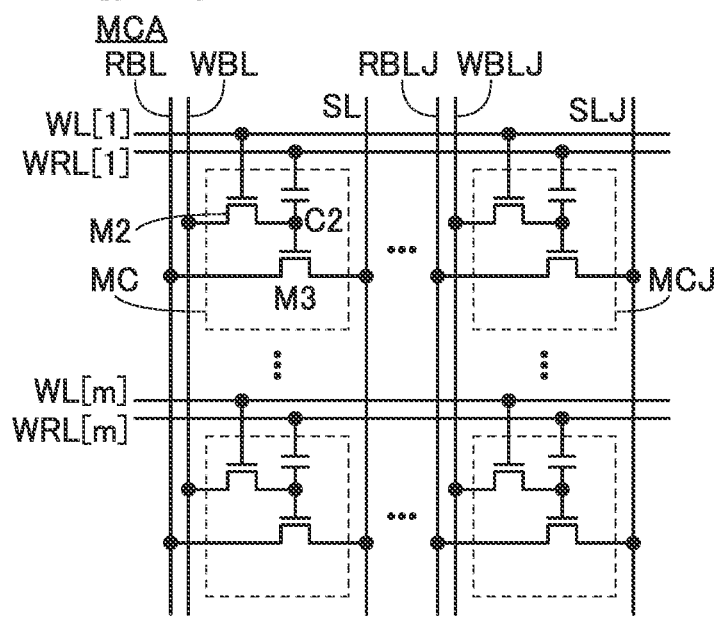
FIG. 10A, FIG. 10B, and FIG. 10C are block diagrams showing circuits included in a semiconductor device.

FIG. 10A shows an example of the memory cell array MCA including memory cells each including two transistors and one capacitor. The memory cell MC (the redundant memory cell MCJ) includes a transistor M2, a transistor M3, and a capacitor C2.

In the memory cell MC in the i-th column, the first terminal of the transistor M2 is electrically connected to the first terminal of the capacitor C2. The second terminal of the transistor M2 is electrically connected to the wiring WBL. The gate of the transistor M2 is electrically connected to the wiring WL[i]. The second terminal of the capacitor C2 is electrically connected to the wiring WRL[i]. The first terminal of the transistor M3 is electrically connected to the wiring RBL, the second terminal of the transistor M3 is electrically connected to a wiring SL, and the gate of the transistor M3 is electrically connected to the first terminal of the capacitor C2. FIG. 10A does not show the wiring WL[i] and the wiring WRL[i] but shows the wiring WL[1], the wiring WL[m], the wiring WL[1], and the wiring WL[m].

In the redundant memory cell MCJ in the i-th column, the first terminal of the transistor M2 is electrically connected to the first terminal of the capacitor C2. The second terminal of the transistor M2 is electrically connected to the wiring WBLJ. The gate of the transistor M2 is electrically connected to the wiring WL[i]. The second terminal of the capacitor C2 is electrically connected to the wiring CL. The first terminal of the transistor M3 is electrically connected to the wiring RBLJ, the second terminal of the transistor M3 is electrically connected to a wiring SLJ, and the gate of the transistor M3 is electrically connected to the first terminal of the capacitor C2.

The wiring WBL (the wiring WBLJ) functions as a write bit line, the wiring RBL (the wiring RBLJ) functions as a read bit line, and the wiring WBL and the wiring RBL correspond to the wiring BL described in Embodiment 1. The wiring WL functions as a write word line. The wiring WRL functions as a read word line. For example, in data writing and data reading, it is preferable that a high-level potential be applied to the wirings CL and in data retention, it is preferable that a low-level potential, a ground potential, or the like be applied to the wiring WRL. The wiring SL (the wiring SLJ) functions as a wiring that supplies a predetermined potential when data is read out from the memory cell MC (the redundant memory cell MCJ). The wiring SL (the wiring SLJ) described here corresponds to the wirings CL described in Embodiment 1.

When data is written to the memory cell MC (the redundant memory cell MCJ) in the i-th row, a high-level potential is applied to the wiring WL[i] to bring the transistor M2 into the on state, that is, the wiring WBL (the wiring WBLJ) and the first terminal of the capacitor C2 are brought into a conduction state. Specifically, when the transistor M2 is in the on state, a potential corresponding to information to be stored is applied to the wiring WBL (the wiring WBLJ), whereby the potential is written to the first terminal of the capacitor C2 and the gate of the transistor M3. After that, a low-level potential is applied to the wiring WL[i] to bring the transistor M2 into the off state, whereby the potential of the first terminal of the capacitor C2 and the potential of the gate of the transistor M3 are retained.

When data is read out from the memory cell MC (the redundant memory cell MCJ) in the i-th row, a predetermined potential is applied to the wiring SL (the wiring SLJ). The current flowing between a source and a drain of the transistor M3 and the potential of the first terminal of the transistor M3 are determined by the potential of the gate of the transistor M3 and the potential of the second terminal of the transistor M3. Thus, the potential of the wiring RBL (the wiring RBLJ) connected to the first terminal of the transistor M3 is read out, so that the potential of the first terminal of the capacitor C2 (or the gate of the transistor M3) can be read out. In other words, information written into this memory cell can be read out from the potential retained in the first terminal of the capacitor C2 (the gate of the transistor M3).

The memory cell MC (the redundant memory cell MCJ) described in Embodiment 1 is not limited to the memory cell MC (the redundant memory cell MCJ) in FIG. 10A. The circuit connection or the choice of a circuit for the memory cell MC (the redundant memory cell MCJ) in FIG. 10A can be changed in accordance with situations. For example, a transistor including a back gate can be used as the transistor M2 and the transistor M3.

In particular, when an OS transistor is used as the transistor M2, a semiconductor device including the memory cells MC (the redundant memory cells MCJ) shown in FIG. 10A can be referred to as a NOSRAM (Nonvolatile Oxide Semiconductor Random Access Memory).

CONFIGURATION EXAMPLE 7

Figure 10B:
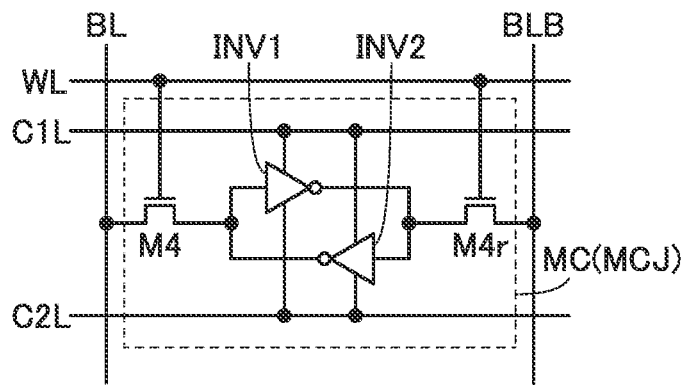

FIG. 10B is the memory cell MC (the redundant memory cell MCJ) showing an example of an SRAM (Static Random Access Memory). The memory cell MC includes a transistor M4, a transistor M4r, a logic circuit INV1, and a logic circuit INV2.

The logic circuit INV1 and the logic circuit INV2 have a function of generating and outputting an inverted signal of a signal input to the circuit. As the logic circuit INV1 and the logic circuit INV2, for example, an inverter circuit can be used. In addition to the inverter circuit, a NAND circuit, a NOR circuit, an XOR circuit, a logic circuit including a combination thereof, or the like can be used.

The first terminal of the transistor M4 is electrically connected to the wiring BL, the second terminal of the transistor M4 is electrically connected to the input terminal of the logic circuit INV1 and the output terminal of the logic circuit INV2, and the gate of the transistor M4 is electrically connected to the wiring WL. The first terminal of the transistor M4r is electrically connected to a wiring BLB, the second terminal of the transistor M4r is electrically connected to the output terminal of the logic circuit INV1 and the input terminal of the logic circuit INV2, and the gate of the transistor M4r is electrically connected to the wiring WL.

Each high-power-input terminal of the logic circuit INV1 and the logic circuit INV2 is electrically connected to a wiring C1L, and each low-power-input terminal of the logic circuit INV1 and the logic circuit INV2 is electrically connected to a wiring C2L. The wiring C1L functions as a wiring for supplying a high-level potential, the wiring C2L functions as a wiring for supplying a low-level potential, and the wiring C1L and the wiring C2L correspond to the wiring CL described in Embodiment 1.

Data is written in the following manner: a high-level potential is applied to the wiring WL to bring the transistor M4 into the on state, and the wiring BL and the input terminal of the logic circuit INV1 and the output terminal of the logic circuit INV2 are brought into a conduction state. At this time, the transistor M4r is also brought into the on state, and the wiring BLB and the output terminal of the logic circuit INV1 and the input terminal of the logic circuit INV2 are brought into a conduction state. Thus, when data is written to the memory cell MC (the redundant memory cell MCJ), a write data signal can be sent from each of the wiring BL and the wiring BLB. The write data signal input to the wiring BL is preferably an inverted signal of the signal input to the wiring BLB.

The memory cell MC (the redundant memory cell MCJ) described in Embodiment 1 is not limited to the memory cell MC (the redundant memory cell MCJ) in FIG. 10B. The circuit connection or the choice of the memory cell MC (the redundant memory cell MCJ) in FIG. 10B can be changed in accordance with situations. For example, as shown in FIG. 10C, a transistor M5, a transistor M5r, a capacitor C3, and a capacitor C3r can be provided to the memory cell MC (the redundant memory cell MCJ) in FIG. 10B.

The first terminal of the transistor M5 is electrically connected to the second terminal of the transistor M4, the input terminal of the logic circuit INV1, and the output terminal of the logic circuit INV2, and the second terminal of the transistor M5 is electrically connected to the first terminal of the capacitor C3, and the gate of the transistor M5 is electrically connected to the wiring W2L. The first terminal of the transistor M5r is electrically connected to the second terminal of the transistor M4r, the output terminal of the logic circuit INV1, and the input terminal of the logic circuit INV2, the second terminal of the transistor M5r is electrically connected to the first terminal of the capacitor C3r, and the gate of the transistor M5r is electrically connected to the wiring W2L. Each second terminal of the capacitor C3 and the capacitor C3r is electrically connected to the wiring CL.

Figure 10C:
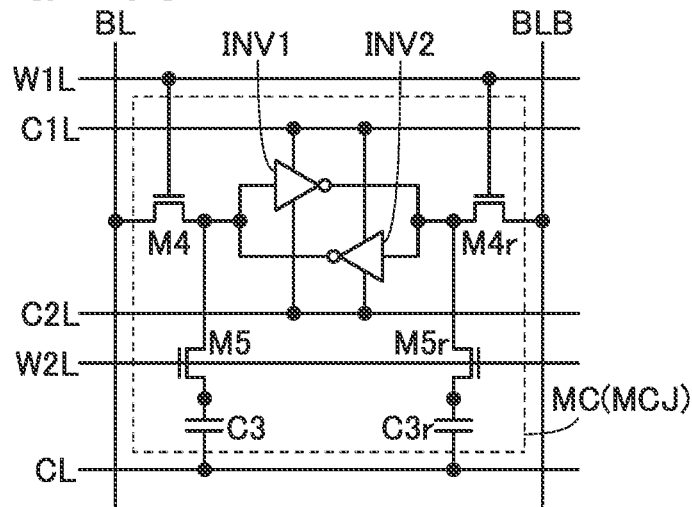

Note that a wiring W1L shown in the memory cell MC (the redundant memory cell MCJ) in FIG. 10C corresponds to the wiring WL in FIG. 10B. The wiring W2L functions as the second word line, which switches between on and off of the transistor M5 and the transistor M5r. The wiring W1L and the wiring W2L correspond to the wiring WL described in Embodiment 1.

The wiring CL functions as a wiring for applying a predetermined potential to each second terminal of the capacitor C3 and the capacitor C3r. Note that the wiring CL, the wiring C1L, and the wiring C2L correspond to the wiring CL described in Embodiment 1.

By bringing the transistor M5 and the transistor M5r into the on state using the wiring W2L, the second terminal of the transistor M4 and the first terminal of the capacitor C3 are brought into a conduction state, and the second terminal of the transistor M4r and the first terminal of the capacitor C3r are brought into a conduction state. This causes the potentials of the input terminal of the logic circuit INV1 and the output terminal of the logic circuit INV2 to be written to the first terminal of the capacitor C3, and causes the potentials of the output terminal of the logic circuit INV1 and the input terminal of the logic circuit INV2 to be written to the first terminal of the capacitor C3r. After that, by bringing the transistor M5 and the transistor M5r into the off state using the wiring W2L, the first terminals of the capacitor C3 and the capacitor C3r can be in a floating state, by which the potentials written to the first terminals of the capacitor C3 and the capacitor C3r can be retained. At this time, even when the voltage supplies by the wiring C1L and the wiring C2L is temporarily stopped to stop driving of the logic circuit INV1 and the logic circuit INV2, data can be retained by the transistor M5, the transistor M5r, the capacitor C3, and the capacitor C3r.

Note that this embodiment can be combined with any of the other embodiments in this specification as appropriate.

Embodiment 3

In this embodiment, a structure example of the semiconductor device described in the above embodiments and a transistor structure example which can be used to the semiconductor device are described.

Figure 11:
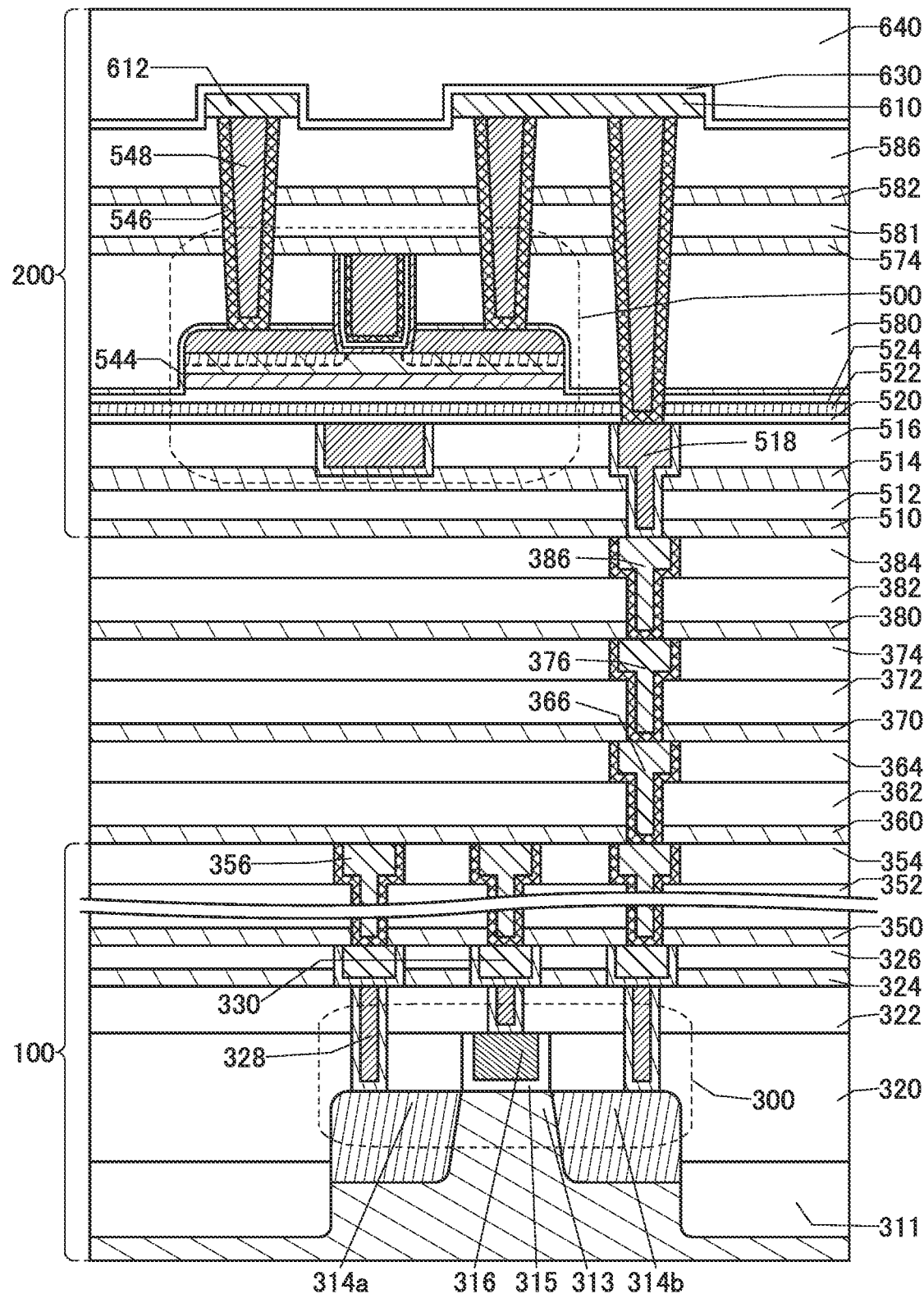
FIG. 11 is a schematic cross-sectional view showing a structure of a semiconductor device.

The semiconductor device shown in FIG. 11 includes, for example, a memory portion 100 and a control portion 200. In FIG. 11, the control portion 200 is provided over the memory portion 100 so as to overlap with the memory portion 100. The semiconductor device shown in FIG. 11 can be an example of the semiconductor devices shown in FIG. 2A, FIG. 3, and FIG. 4, for example. Specifically, the memory portion 100 corresponds to the memory cell unit MCL or the memory cell array MCA in any of FIG. 2A, FIG. 3, and FIG. 4, and the control portion 200 corresponds to the peripheral circuit OSC of FIG. 2A, FIG. 3, and FIG. 4.

When the semiconductor device of one embodiment of the present invention has the structure shown in FIG. 11, the transistor structure of the memory portion 100 can be different from that of the control portion 200. Specifically, for example, a Si transistor can be used as the transistor included in the memory portion 100, and an OS transistor can be used as the transistor included in the control portion 200. In other words, the memory portion 100 and the control portion 200 overlap with each other, so that transistors having different performances and structures can be used in the same semiconductor device.

Figure 14A:
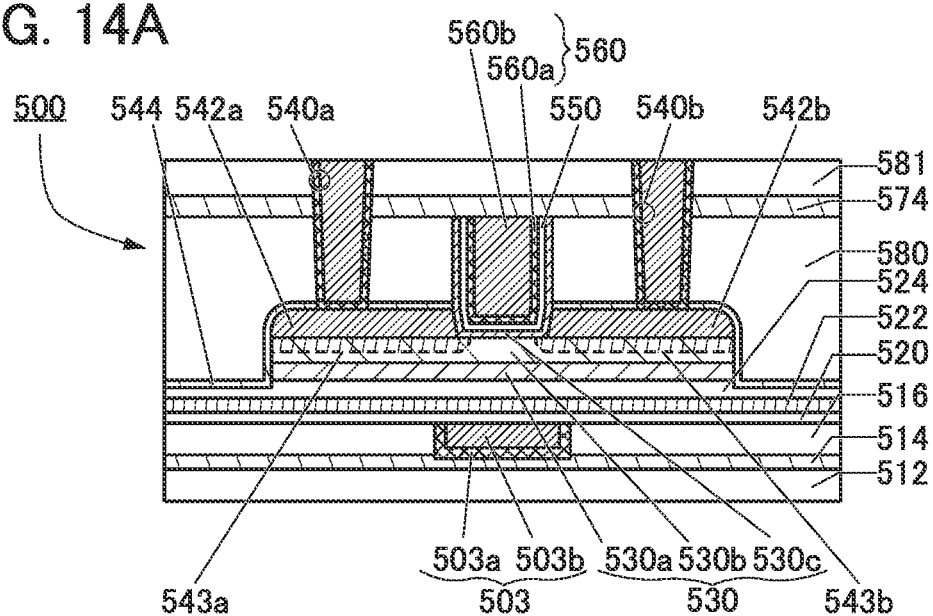
FIG. 14A, FIG. 14B, and FIG. 14C are schematic cross-sectional views showing a structure of a semiconductor device.
Figure 14B:
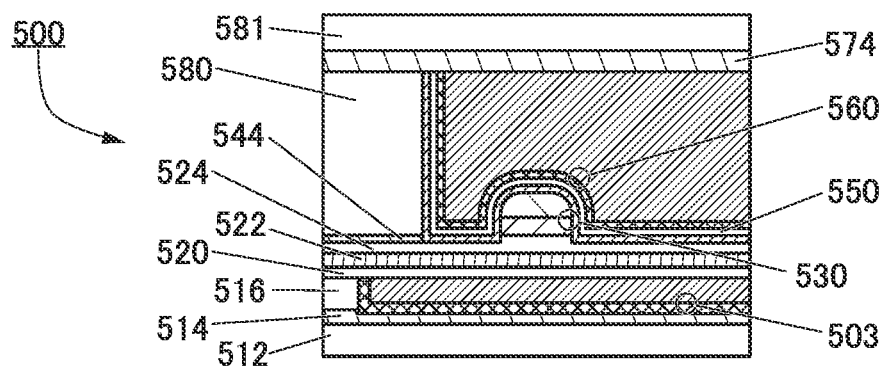
Figure 14C:
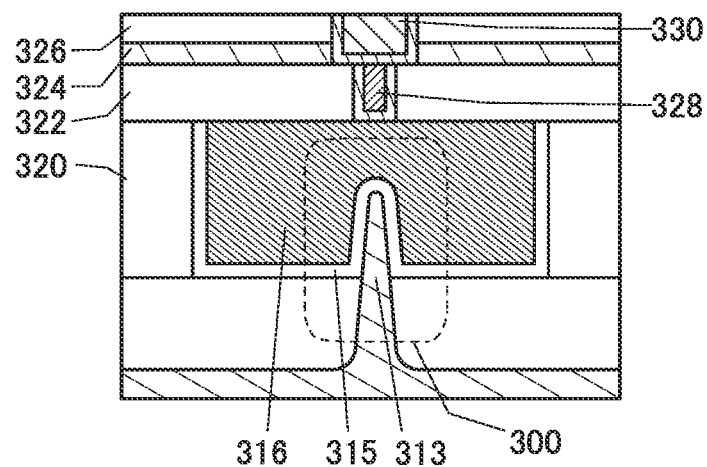

A semiconductor device in FIG. 11 includes a transistor 300 and a transistor 500. FIG. 14A is a cross-sectional view of the transistor 500 in the channel length direction, FIG. 14B is a cross-sectional view of the transistor 500 in the channel width direction, and FIG. 14C is a cross-sectional view of the transistor 300 in the channel width direction.

The transistor 500 is a transistor containing a metal oxide in its channel formation region (OS transistor). Since the off-state current of the transistor 500 is low, when the transistor 500 is used as an OS transistor included in the semiconductor device, written data voltage or charge can be retained for a long time. In other words, power consumption of the semiconductor device can be reduced because the semiconductor device has a low frequency of refresh operation or requires no refresh operation.

The semiconductor device described in this embodiment includes the transistor 300 and the transistor 500 as shown in FIG. 11. The transistor 500 is provided above the transistor 300.

The transistor 300 is provided over a substrate 311 and includes a conductor 316, an insulator 315, a semiconductor region 313 that is part of the substrate 311, and a low-resistance region 314a and a low-resistance region 314b functioning as a source region and a drain region. Note that the transistor 300 can be used as the transistor included in the string SRG, the memory cell MC, and the redundant memory cell MCJ in the above embodiments, for example.

A semiconductor substrate (e.g., single crystal substrate or silicon substrate) is preferably used as the substrate 311.

In the transistor 300, the top surface and a side surface in the channel width direction of the semiconductor region 313 are covered with the conductor 316 with the insulator 315 therebetween, as illustrated in FIG. 14C. The effective channel width is increased in the Fin-type transistor 300, whereby the on-state characteristics of the transistor 300 can be improved. In addition, since contribution of an electric field of the gate electrode can be increased, the off-state characteristics of the transistor 300 can be improved.

Note that the transistor 300 can be a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or a conductive material such as a metal material, an alloy material, or a metal oxide material.

Note that the work function depends on a material used for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 12:
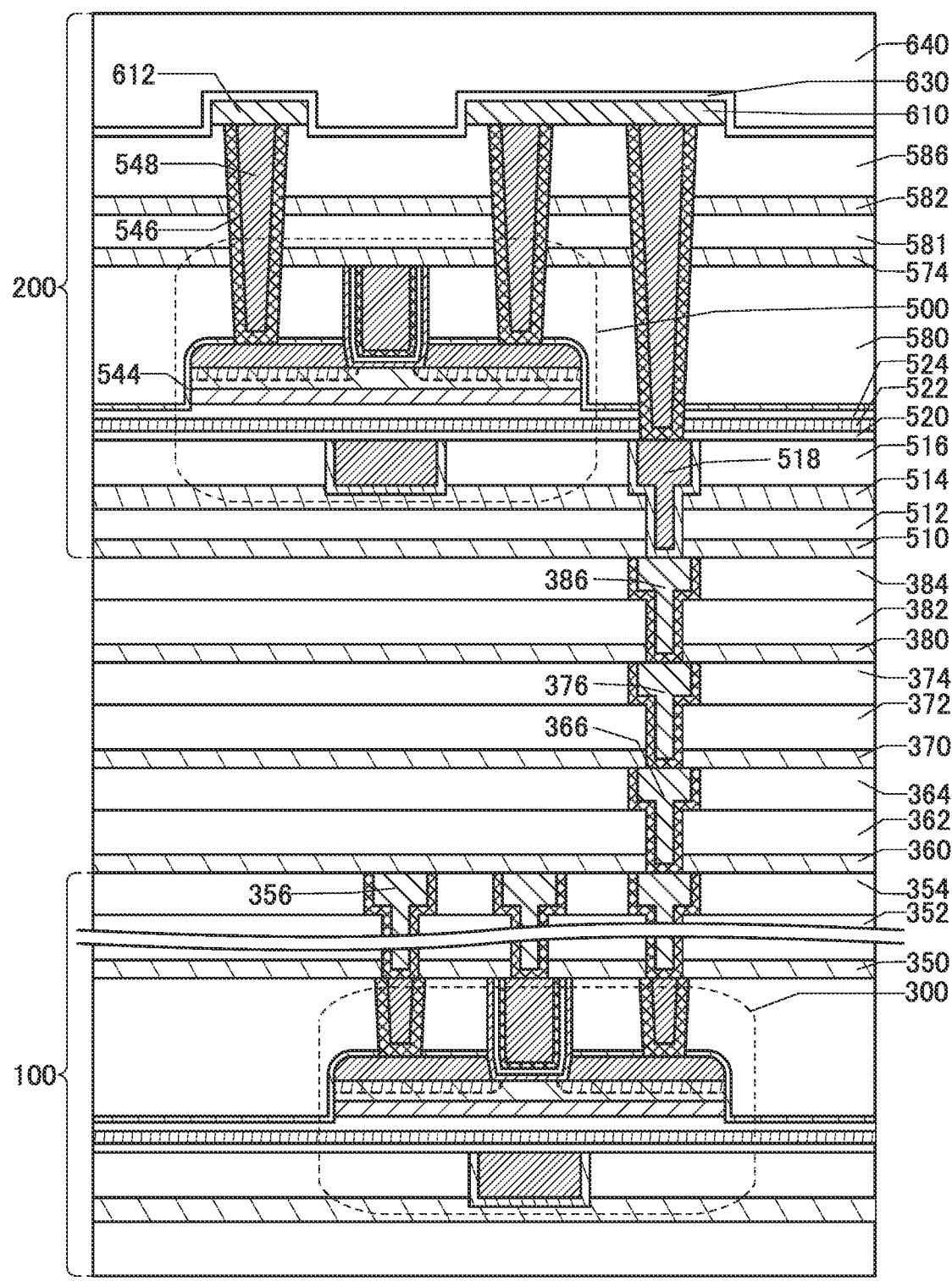
FIG. 12 is a schematic cross-sectional view showing a structure of a semiconductor device.

Note that the transistor 300 shown in FIG. 11 and FIG. 14C is an example and the structure is not limited thereto; an appropriate transistor is used in accordance with a circuit structure or a driving method. For example, when the semiconductor device is a single-polarity circuit including only OS transistors (this means the same-polarity transistors such as only n-channel transistors), the transistor 300 has a structure similar to that of the transistor 500 including an oxide semiconductor as shown in FIG. 12. Note that the details of the transistor 500 are described later.

The kind of a substrate where the semiconductor device of FIG. 12 is formed is not limited to a specific one. Examples of the substrate include a semiconductor substrate (e,g., a single crystal substrate or a silicon substrate), an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, a paper including a fibrous material, and a base material film. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, aramid, epoxy, an inorganic vapor deposition film, paper, and the like.

An insulator 320, an insulator 322, an insulator 324, and an insulator 326 are stacked in this order to cover the transistor 300.

As the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for planarizing a level difference caused by the transistor 300 or the like provided under the insulator 322. For example, the top surface of the insulator 322 may be planarized by planarization treatment using a chemical mechanical polishing (CMP) method or the like to improve planarity.

In addition, for the insulator 324, it is preferable to use a film having a barrier property that prevents diffusion of hydrogen or impurities from the substrate 311, the transistor 300, or the like to a region where the transistor 500 is provided.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for the interlayer film, the parasitic capacitance generated between wirings can be reduced.

In addition, a conductor 328, a conductor 330, and the like that are connected to the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Furthermore, in this specification and the like, a wiring and a plug connected to the wiring can be a single component. That is, in some cases, part of a conductor functions as a wiring or part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 11, an insulator 350, an insulator 352, and an insulator 354 are stacked sequentially and provided. A conductor 356 is formed in the insulator 350, the insulator 352, and the insulator 354. The conductor 356 has a function of a plug or a wiring that is connected to the transistor 300. Note that the conductor 356 can be formed using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 300 and the transistor 500 can be separated by a barrier layer, so that the diffusion of hydrogen from the transistor 300 into the transistor 500 can be inhibited.

Note that as the conductor having a barrier property against hydrogen, tantalum nitride can be used, for example. The use of a stack including tantalum nitride and tungsten having high conductivity can inhibit the diffusion of hydrogen from the transistor 300 while the conductivity of a wiring is kept. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 11, an insulator 360, an insulator 362, and an insulator 364 are stacked sequentially and provided. Moreover, a conductor 366 is formed in the insulator 360, the insulator 362, and the insulator 364. The conductor 366 has a function of a plug or a wiring. Note that the conductor 366 can be formed using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 364 and the conductor 366. For example, in FIG. 11, an insulator 370, an insulator 372, and an insulator 374 are stacked sequentially and provided. Furthermore, a conductor 376 is formed in the insulator 370, the insulator 372, and the insulator 374. The conductor 376 has a function of a plug or a wiring. Note that the conductor 376 can be formed using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 374 and the conductor 376. For example, in FIG. 11, an insulator 380, an insulator 382, and an insulator 384 are stacked sequentially and provided. Moreover, a conductor 386 is formed in the insulator 380, the insulator 382, and the insulator 384. The conductor 386 has a function of a plug or a wiring. Note that the conductor 386 can be formed using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 and the transistor 500 can be separated by a barrier layer, so that the diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked in this order over the insulator 384. A substance having a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen or impurities from the substrate 311, a region where the transistor 300 is provided, or the like to the region where the transistor 500 is provided. Therefore, a material similar to that for the insulator 324 can be used.

As the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used as the insulator 510 and the insulator 514, for example.

In particular, aluminum oxide has an excellent blocking effect that prevents the passage of both oxygen and impurities such as hydrogen and moisture, which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, as the insulator 512 and the insulator 516, a material similar to that for the insulator 320 can be used, for example. Furthermore, when a material with a comparatively low dielectric constant is used as these insulators, parasitic capacitance generated between wirings can be reduced. A silicon oxide film, a silicon oxynitride film, or the like can be used as the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. The conductor 518 has a function of a plug or a wiring that is connected to the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With the structure, the transistor 300 and the transistor 500 can be separated by the layer having a barrier property against oxygen, hydrogen, and water; thus, diffusion of hydrogen from the transistor 300 to the transistor 500 can be inhibited.

The transistor 500 is provided over the insulator 516.

As shown in FIG. 14A and FIG. 14B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom and a side surface of the opening, an insulator 550 positioned on a formation surface of the oxide 530c, and a conductor 560 positioned on a formation surface of the insulator 550.

As shown in FIG. 14A and FIG. 14B, an insulator 544 is preferably provided between the insulator 580 and the oxide 530a, the oxide 530b, the conductor 542a, and the conductor 542b. In addition, as shown in FIG. 14A and FIG. 14B, the conductor 560 preferably includes a conductor 560a provided inside the insulator 550 and a conductor 560b embedded inside the conductor 560a. As shown in FIG. 14A and FIG. 14B, an insulator 574 is preferably provided over the insulator 580, the conductor 560, and the insulator 550.

Note that in the following description, the oxide 530a, the oxide 530b, and the oxide 530c are sometimes collectively referred to as an oxide 530.

Note that although a structure of the transistor 500 in which three layers of the oxide 530a, the oxide 530b, and the oxide 530c are stacked in a region where a channel is formed and its vicinity is shown, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Although the conductor 560 is shown to have a stacked-layer structure of two layers in the transistor 500, the present invention is not limited thereto. For example, the conductor 560 may have a single-layer structure or a stacked-layer structure of three or more layers. The transistor 500 illustrated in FIG. 11, FIG. 14A, and FIG. 14B is an example, and the structure is not limited thereto; an appropriate transistor can be used in accordance with a circuit structure or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the transistor 500 can have improved switching speed and excellent frequency characteristics.

The conductor 560 functions as the first gate (also referred to as top gate) electrode in some cases. The conductor 503 functions as the second gate (also referred to as bottom gate) electrode in some cases. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of the first gate electrode and the second gate electrode is referred to as a surrounded channel (S-channel) structure.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that the conductor 503b is shown as a single layer but may have a stacked-layer structure, for example, a stack of the above conductive material and titanium or titanium nitride.

The insulator 520, the insulator 522, and the insulator 524 have a function of the second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_O$H is cut occurs, i.e., a reaction of $V_O$H→$V_O$+H occurs. Part of hydrogen generated at this time is bonded to oxygen to be H$_2$O, and removed from the oxide 530 or an insulator near the oxide 530 in some cases. Some hydrogen is diffused in or gettered by the conductor 542a and the conductor 542b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate (O$_2$/(O$_2$+Ar)) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (V$_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of $V_O$+O→null. Furthermore, hydrogen remaining in the oxide 530 reacts with supplied oxygen, so that the hydrogen can be removed as H$_2$O (dehydrogenation). This can inhibit recombination of hydrogen remaining in the oxide 530 with oxygen vacancies and formation of $V_O$H.

In the case where the insulator 524 includes an excess-oxygen region, it is preferred that the insulator 522 have a function of inhibiting diffusion of oxygen (e.g., an oxygen atom, an oxygen molecule, or the like) (the oxygen is less likely to pass).

When the insulator 522 has a function of inhibiting diffusion of oxygen or impurities, oxygen contained in the oxide 530 is not diffused to the insulator 520 side, which is preferable. Furthermore, the conductor 503 can be prevented from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during operation of the transistor can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride, which have thermal stability, are suitable. Furthermore, when an insulator which is a high-k material is combined with silicon oxide or silicon oxynitride, the insulator 520 having a stacked-layer structure that has thermal stability and a high relative permittivity can be obtained.

Note that in the transistor 500 in FIG. 14A and FIG. 14B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. The In-M-Zn oxide that can be used as the oxide 530 is particularly preferably a CAAC-OS or a CAC-OS each of which will be described in Embodiment 4. Furthermore, as the oxide 530, an In—Ga oxide or an In—Zn oxide may be used.

Furthermore, a metal oxide with a low carrier concentration is preferably used as the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form $V_OH$ in some cases. The $V_OH$ serves as a donor and an electron that is a carrier is generated in some cases. In other cases, bonding of part of hydrogen to oxygen bonded to a metal atom generates electrons serving as carriers. Thus, a transistor using a metal oxide containing a large amount of hydrogen is likely to have normally-on characteristics. Moreover, hydrogen in a metal oxide is easily transferred by a stress such as heat or an electric field; thus, a large amount of hydrogen in a metal oxide might reduce the reliability of the transistor. In one embodiment of the present invention, $V_OH$ in the oxide 530 is preferably reduced as much as possible so that the oxide 530 becomes a highly purified intrinsic or substantially highly purified intrinsic oxide. It is effective to remove impurities such as moisture and hydrogen in a metal oxide (sometimes described as dehydration or dehydrogenation treatment) and to compensate for oxygen vacancies by supplying oxygen to the metal oxide (sometimes described as oxygen adding treatment) in order to obtain a metal oxide whose $V_OH$ is sufficiently reduced. When a metal oxide with a sufficiently low concentration of impurities such as $V_OH$ is used for a channel formation region of a transistor, the transistor can have stable electrical characteristics.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used as the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

When a metal oxide is used as the oxide 530, the metal oxide has a wide band gap, is an intrinsic (also referred to as i-type) or substantially intrinsic semiconductor, and the carrier concentration of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

When a metal oxide is used as the oxide 530, contact between the conductor 542a (the conductor 542b) and the oxide 530 can make oxygen in the oxide 530 diffuse into the conductor 542a (the conductor 542b), resulting in oxidation of the conductor 542a (the conductor 542b). When the conductor 542a (the conductor 542b) is oxidized, the conductivity of the conductor 542a (the conductor 542b) is likely to be decreased. Diffusion of oxygen in the oxide 530 into the conductor 542a (the conductor 542b) can be interpreted as absorption of oxygen in the oxide 530 by the conductor 542a (the conductor 542b).

When oxygen in the oxide 530 is diffused into the conductor 542a and the conductor 542b, a layer is sometimes formed between the conductor 542a and the oxide 530b and between the conductor 542b and the oxide 530b. The layer contains more oxygen than the conductor 542a and the conductor 542b does, and thus presumably has an insulating property. In this case, a three-layer structure of the conductor 542a and the conductor 542b, the layer, and the oxide 530b can be regarded as a three-layer structure of a metal, an insulator, and a semiconductor and is sometimes referred to as a MIS (Metal-Insulator-Semiconductor) structure or a diode junction structure having an MIS structure as its main part.

The above layer is not necessarily formed between the conductor 542a (the conductor 542b) and the oxide 530b;

for example, the layer is sometimes formed between the conductor 542a (the conductor 542b) and the oxide 530c, or the layer is sometimes formed between the conductor 542a (the conductor 542b) and the oxide 530b and between the conductor 542a (the conductor 542b) and the oxide 530c.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of oxides that differ in the atomic ratio of metal atoms. Specifically, the atomic proportion of the element M in constituent elements in the metal oxide used as the oxide 530a is preferably greater than the atomic proportion of the element M in constituent elements in the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a. Moreover, a metal oxide that can be used as the oxide 530a or the oxide 530b can be used as the oxide 530c.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 14A and FIG. 14B, a stacked-layer structure of two or more layers may be employed. For example, a tantalum nitride film and a tungsten film may be stacked. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as shown in FIG. 14A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. The channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 to the oxide 530b through the oxide 530c and the insulator 550 can be inhibited. Furthermore, oxidation of the conductor 560 due to excess oxygen contained in the insulator 580 can be inhibited.

The insulator 550 functions as the first gate insulating film. The insulator 550 is preferably positioned in contact with an inner side (the top surface and the side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided as the insulator 550 in contact with the top surface of the oxide 530c, oxygen can be efficiently supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be inhibited. As the metal oxide, a material that can be used as the insulator 544 is used.

Note that the insulator 550 may have a stacked-layer structure like the second gate insulating film. As miniaturization and high integration of transistors progress, a problem such as leakage current might arise because of a thinner gate insulating film. For that reason, when the insulating film functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

Although the conductor 560 functioning as the first gate electrode has a two-layer structure in FIG. 14A and FIG. 14B, the conductor 560 may have a single-layer structure or a stacked-layer structure of three or more layers.

As the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting oxygen diffusion, it is possible to prevent a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced electrical resistance value to be a conductor. This can be referred to as an OC (Oxide Conductor) electrode.

In addition, a conductive material containing tungsten, copper, or aluminum as its main component is preferably used as the conductor 560b. The conductor 560b also functions as a wiring and thus is preferably formed using a conductor having high conductivity. For example, a conductive material containing tungsten, copper, or aluminum as its main component can be used. The conductor 560b can have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide, in which an excess-oxygen region can be easily formed in a later step, are preferable.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening of the insulator 580 is formed to overlap with a region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; hence, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used as the insulator 582. Therefore, a material similar to that as the insulator 514 can be used as the insulator 582. As the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used as a protective film of the transistor 500.

An insulator 586 is provided over the insulator 582. For the insulator 586, a material similar to that for the insulator 320 can be used. Furthermore, when a material with a comparatively low dielectric constant is used as these insulators, parasitic capacitance generated between wirings can be reduced. For example, a silicon oxide film, a silicon oxynitride film, or the like can be used as the insulator 586.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the transistor 500 or the transistor 300. The conductor 546 and the conductor 548 can be provided using materials similar to those as the conductor 328 and the conductor 330.

After the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that as the insulator 522, for example.

A conductor 610 can be provided over the insulator 586. The conductor 610 functions as a plug or a wiring electrically connecting the transistor 500 to the transistor 300.

In addition, a conductor 612 can be provided over the conductor 546 and the conductor 548. The conductor 612 has a function of a plug or a wiring that is connected to the transistor 500. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in FIG. 11, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

An insulator 640 is provided over the insulator 630. The insulator 640 can be provided using a material similar to that for the insulator 320. In addition, the insulator 640 can function as a planarization film that covers an uneven shape therebelow.

Note that one embodiment of the present invention is not limited to the structure of the semiconductor device in FIG.

11. For example, the memory portion 100 of the semiconductor device in FIG. 11 can have a three-dimensional NAND memory device.

Figure 13:
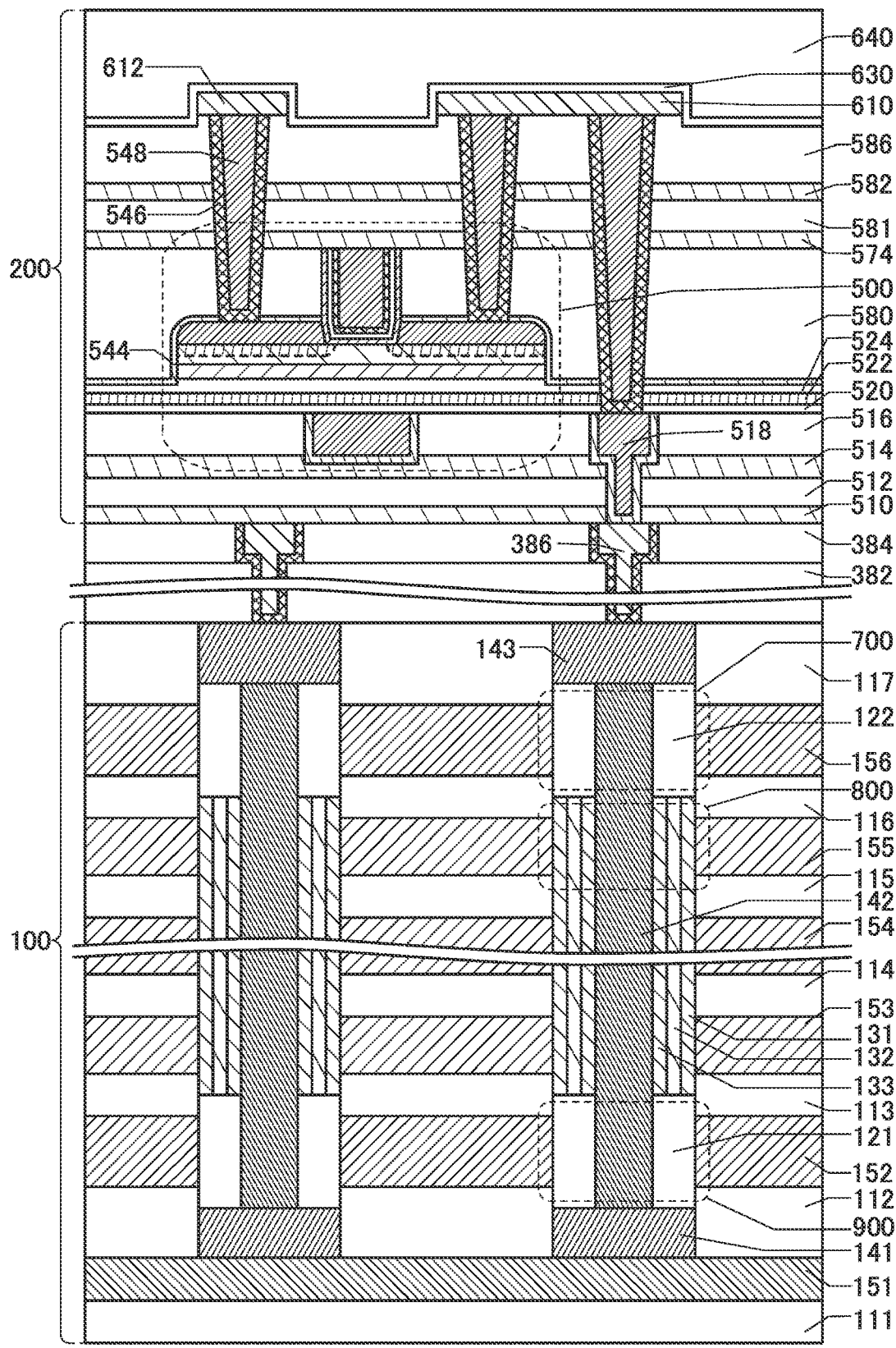
FIG. 13 is a schematic cross-sectional view showing a structure of a semiconductor device.

FIG. 13 shows an example in which the memory portion 100 includes a three-dimensional NAND memory device. The memory portion 100 in the semiconductor device shown in FIG. 13 includes a transistor 700, transistors 800, and a transistor 900 as components of a three-dimensional NAND memory device. The transistor 700 corresponds to the transistor BTr in FIG. 3, the transistor 800 corresponds to the transistor CTr in FIG. 3, and corresponds to the transistor STr in FIG. 3.

The memory portion 100 shown in FIG. 13 is provided over a substrate. The memory portion 100 includes an insulator 111 to an insulator 117, an insulator 121, an insulator 122, an insulator 131, an insulator 132, an insulator 133, a conductor 151 to a conductor 156, and a semiconductor 141 to a semiconductor 143 over the substrate.

As the substrate, the above-described substrate which can be used for the semiconductor device in FIG. 12 can be used in some cases, for example.

The insulator 111 is provided over the substrate included in the semiconductor device. When the insulator 111 functions as a base film of the substrate, the insulator 111 is preferably formed by a deposition method with good planarity.

As the insulator 111, a material containing silicon oxide or silicon oxynitride can be used, for example. For example, a single layer or a stacked layer of an insulator including one or more materials selected from boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum can be used in some cases.

The conductor 151 is stacked over the insulator 111. The conductor 151 sometimes functions as the wiring CL in FIG. 3.

It is possible to use, as the conductor 151, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and ruthenium, for example. A semiconductor having high electrical conductivity, typified by polycrystalline silicon containing an impurity element such as phosphorus, or silicide such as nickel silicide can be used. A conductive material containing oxygen and a metal element contained in the metal oxide described in this embodiment can be used. A conductive material containing a metal element such as titanium or tantalum and nitrogen can be used. For example, a conductive material containing nitrogen, such as titanium nitride or tantalum nitride, can be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added can be used, for example. Furthermore, indium gallium zinc oxide containing nitrogen can be used, for example. Using such a material in some cases allows capture of hydrogen or water entering from a surrounding insulator or the like.

There is no particular limitation on a formation method of the conductor 151. The conductor 151 can be formed by a sputtering method, a CVD method (including a thermal CVD method, an MOCVD method, a PECVD method, or the like), a molecular beam epitaxy (MBE) method, an atomic layer deposition (ALD) method, or a pulsed laser deposition (PLD) method, for example.

An insulator 112, a conductor 152, an insulator 113, a conductor 153, and an insulator 114 are stacked in this order over the conductor 151. A conductor 154, an insulator 115, a conductor 155, an insulator 116, the conductor 156, and the insulator 117 are provided over the insulator 114.

The insulator 112 to the insulator 117 can be formed using, for example, a material similar to that of the insulator 111. The insulator 112 to the insulator 117 are preferably formed using a material with low dielectric constant, for example. When a material with low dielectric constant is used as the insulator 112 to the insulator 117, the parasitic capacitances generated by the conductor 152 to the conductor 156 and by the insulator 112 to the insulator 117 can be reduced. This increases the driving speed of the memory portion 100.

There is no particular limitation on a method of forming the insulator 112 to the insulator 117. The insulator 112 to the insulator 117 can be formed by a sputtering method, a CVD method (including a thermal CVD method, an MOCVD method, a PECVD method, or the like), an MBE method, an ALD method, or a PLD method, for example.

The conductor 152 functions as the gate of the transistor 900 (the transistor STr in FIG. 3) and the wiring SSL in FIG. 3. The conductor 153 to the conductor 155 function as gates of the transistors 800 (the transistors CTr in FIG. 3) and the wirings WL in FIG. 3. The conductor 156 functions as the gate of the transistor 700 (the transistor BTr in FIG. 3) and the wiring BSL in FIG. 3.

The conductor 152 to the conductor 156 can be formed using a material similar to that used as the conductor 151, for example. The conductor 152 to the conductor 156 can be formed in a manner similar to that of the conductor 151.

In addition, an opening is provided in the insulator 112 to the insulator 117 and the conductor 152 to the conductor 156. In the opening, the insulator 121, the insulator 122, the insulator 131 to the insulator 133, and the semiconductor 141 to the semiconductor 143 are provided.

The semiconductor 141 is provided in contact with part of side surfaces and the bottom of the opening. Specifically, the semiconductor 141 is provided over part of the conductor 151 and covers part of the insulator 112 that is at the side surfaces of the opening.

As the semiconductor 141, for example, silicon in which impurities are diffused is preferably used. As the impurity, an n-type impurity (donor) can be used. As the n-type impurity, phosphorus or arsenic can be used, for example. As the impurity, a p-type impurity (accepter) can be used. As the p-type impurity, boron, aluminum, or gallium can be used, for example. As silicon, single-crystal silicon, hydrogenated amorphous silicon, microcrystalline silicon, or polycrystalline silicon can be used, for example. The semiconductor 141 can also be formed using a metal oxide with a high carrier concentration other than silicon in some cases. Alternatively, a semiconductor such as Ge or a compound semiconductor such as ZnSe, CdS, GaAs, InP, GaN, SiGe, or the like can be used in some cases.

Note that a material used for a semiconductor 142 and a semiconductor 143 described later is preferably the same as the material for the semiconductor 141, and the carrier concentration of the semiconductor 142 is preferably lower than those of the semiconductor 141 and the semiconductor 143 in some cases.

For example, when silicon to which a p-type impurity is diffused is used as the semiconductor 141, it is preferable that the semiconductor 141 be formed over the conductor 151 and a p-type impurity such as boron, aluminum, or gallium be added to the semiconductor 141. This forms a p-type region in the semiconductor 141. For example, when silicon to which an n-type impurity is diffused is used as the semiconductor 141, it is preferable that the semiconductor 141 be formed over the conductor 151 and an n-type impurity such as phosphorus or arsenic be added to the semiconductor 141. This forms a p-type region in the semiconductor 141.

When a metal oxide is used as the semiconductor 141, it is preferable that the semiconductor 141 be formed over the conductor 151 and a metal element or the like be added to the semiconductor 141, for example. This can increase carrier density of the semiconductor 141. In particular, when a metal oxide described in Embodiment 3 is used as the semiconductor 141, an n-type region (n$^+$ region) is formed in the semiconductor 141. Instead of adding a metal element or the like, water, hydrogen, or the like is added to the semiconductor 141 and then heat treatment is performed, whereby oxygen deficiency can be generated in the semiconductor 141. An n-type region is formed in a region where oxygen vacancy is generated in the semiconductor 141; the carrier concentration of the semiconductor 141 is increased as a result.

The insulator 121 is provided to be in contact with part of the bottom surface of the opening. Specifically, the insulator 121 is provided to cover part of the top of the semiconductor 141 and the conductor 152 on the side surfaces of the opening.

The insulator 121 functions as a gate insulating film of the transistor 900.

As the insulator 121, silicon oxide or silicon oxynitride can be used, for example. In particular, when a metal oxide is used as a semiconductor 142 described later, the insulator 121 is preferably a material which releases oxygen by heating. When the insulator 121 containing oxygen is provided in contact with the metal oxide used as the semiconductor 142, oxygen vacancies in the metal oxide can be reduced, which can improve the reliability of the transistor 900.

Though there is no particular limitation on the deposition method of the insulator 121, the conductor 152, and the insulator 113, a deposition method of a film with good coverage is required since the insulator 121 is formed on the side surfaces of the opening provided in the insulator 112. Examples of a deposition method of a film with good coverage include an ALD method.

The insulator 131 is provided to be in contact with part of the side surfaces of the opening. Specifically, the insulator 131 is provided to cover the conductor 153 to the conductor 155 on the side surfaces of the opening. Thus, the insulator 131 is provided to cover the insulator 114 and the insulator 115 on the side surfaces of the opening.

The insulator 132 is provided to be in contact with the insulator 131. The insulator 133 is provided to be in contact with the insulator 132. That is, the insulator 131 to the insulator 133 are sequentially stacked in this order from the side surfaces to the center of the opening.

The insulator 131 functions as a gate insulating film of the transistor 800. The insulator 132 functions as a charge accumulation layer of the transistor 800. The insulator 133 functions as a tunnel insulating film of the transistor 800.

It is preferable to use silicon oxide or silicon oxynitride as the insulator 131, for example. Alternatively, as the insulator 131, aluminum oxide, hafnium oxide, or an oxide containing aluminum and hafnium can be used, for example. The insulator 131 can be an insulator including a stack of any of the above. When the insulator 131 is made thicker than the insulator 133, charge can be moved from the semiconductor 142 to the insulator 132 through the insulator 133.

It is possible to use silicon nitride or silicon nitride oxide as the insulator 132, for example. Note that a material which can be used as the insulator 132 is not limited thereto.

It is preferable to use silicon oxide or silicon oxynitride as the insulator 133, for example. Alternatively, as the insulator 133, aluminum oxide, hafnium oxide, or an oxide containing aluminum and hafnium can be used, for example. The insulator 133 can be an insulator including a stack of any of the above.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 122 is provided to be in contact with part of the side surfaces of the opening. Specifically, the insulator 122 is provided to cover the conductor 156 on the side surfaces of the opening.

The insulator 122 functions as a gate insulating film of the transistor 700.

The insulator 122 can be formed using a material similar to that of the insulator 121, for example. The insulator 122 can be formed by a method similar to that of the insulator 121.

The semiconductor 142 is provided in contact with the side surfaces of the insulator 121, the insulator 133, and the insulator 122 in the opening.

The semiconductor 142 functions as a channel formation region of the transistor 700, the transistor 800, and the transistor 900 and a wiring electrically connecting the transistor 700, the transistor 800, and the transistor 900 in series.

As the semiconductor 142, silicon is preferably used, for example. As silicon, single-crystal silicon, hydrogenated amorphous silicon, microcrystalline silicon, or polycrystalline silicon can be used, for example. As the semiconductor 142, a metal oxide can be used in some cases other than silicon. Alternatively, a semiconductor such as Ge or a compound semiconductor such as ZnSe, CdS, GaAs, InP, GaN, SiGe, or the like can be used in some cases.

The semiconductor 142 is preferably a semiconductor that does not contain impurities. When silicon is used as the semiconductor 142, the semiconductor 142 is preferably an intrinsic semiconductor. When a metal oxide is used as the semiconductor 142, it is preferable that the impurity concentration (here, the impurity means hydrogen, water, and the like) be low and the density of defect states be low.

The semiconductor 143 is provided to fill the opening after the semiconductor 141, the semiconductor 142, the insulator 121, the insulator 122, the insulator 131, the insulator 132, and the insulator 133 are formed in the opening. Specifically, the semiconductor 143 is provided to be on the insulator 122 and the semiconductor 142, and to be in contact with the side surfaces of the insulator 117.

The semiconductor 143 is preferably a material similar to that of the semiconductor 141, for example. Thus, the polarity of the semiconductor 141 and the polarity of the semiconductor 143 are preferably the same with each other.

The semiconductor device of one embodiment of the present invention is not limited to the NAND memory device included in the memory portion 100 shown in FIG. 11 and the like. The NAND memory device used in the semiconductor device of one embodiment of the present invention can have a different stricture from the NAND memory device shown in FIG. 11 and the like.

For the control portion 200, the descriptions of FIG. 11, FIG. 12, FIG. 14A, and FIG. 14B can be referred to.

Note that this embodiment can be combined with other embodiments or an example in this specification as appropriate.

Embodiment 4

In this embodiment, the compositions of a CAC-OS (Cloud-Aligned Composite Oxide Semiconductor) and a CAAC-OS (c-axis-Aligned Crystalline Oxide Semiconductor) which are metal oxides that can be used in the OS transistor described in the above embodiments is described. Note that in this specification and the like, CAC refers to an example of a function or a material composition and CAAC refers to an example of a crystal structure.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current driving capability in the on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors can be classified into a single crystal oxide semiconductor and a non-single-crystal oxide semiconductor. Examples of a non-single-crystal oxide semiconductor include a CAAC-OS (c-axis aligned crystal crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited due to the distortion of lattice arrangement. This is probably because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

In the nc-OS, a microscopic region e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used in a transistor, a transistor having high field-effect mobility can be achieved. In addition, the transistor having high reliability can be achieved.

An oxide semiconductor with a low carrier concentration is preferably used for a transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. For example, the carrier concentration of the oxide semiconductor is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

A highly purified intrinsic or substantially highly purified intrinsic oxide semiconductor film has a low density of defect states and thus has a low density of trap states in some cases.

Charges trapped by the trap states in the oxide semiconductor take a long time to be released and may behave like fixed charges. Thus, a transistor whose channel formation region is formed in an oxide semiconductor having a high density of trap states has unstable electrical characteristics in some cases.

Accordingly, in order to obtain stable electrical characteristics of the transistor, it is effective to reduce the concentration of impurities in the oxide semiconductor. In addition, in order to reduce the concentration of impurities in the oxide semiconductor, the impurity concentration in an adjacent film is also preferably reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon that is a Group 14 element is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by secondary ion mass spectrometry (SIMS)) are set to lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Furthermore, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurities is used for a channel formation region of a transistor, stable electrical characteristics can be given.

Note that this embodiment can be combined with any of the other embodiments in this specification as appropriate.

Embodiment 5

This embodiment will show examples of a semiconductor wafer where the semiconductor device or the like described in the above embodiment is formed and electronic components incorporating the semiconductor device.

<Semiconductor Wafer>

First, an example of a semiconductor wafer where a semiconductor device or the like is formed is described with reference to FIG. 15A.

Figure 15A:
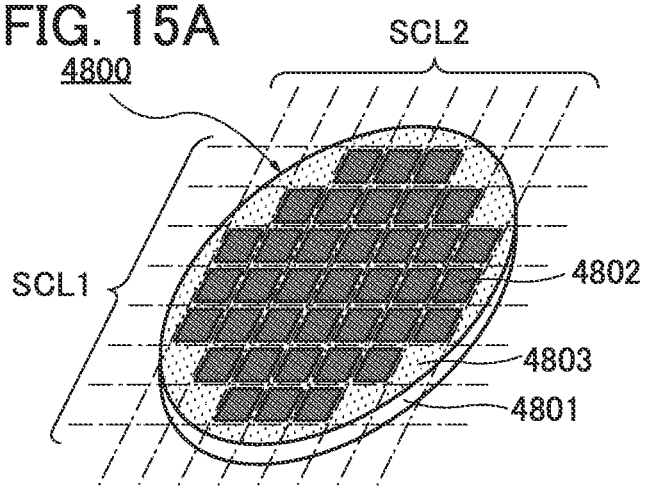
FIG. 15A, FIG. 15B, FIG. 15C, and FIG. 15D are perspective views showing examples of semiconductor wafers and examples of electronic components.

A semiconductor wafer 4800 shown in FIG. 15A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as a dicing line or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe line SCL2.

Figure 15B:
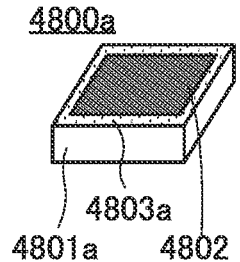

With the dicing step, a chip 4800a as shown in FIG. 15B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 shown in FIG. 15A. The element substrate may be a rectangular semiconductor wafer, for example. The shape of the element substrate can be changed as appropriate, depending on a manufacturing process of an element and an apparatus for manufacturing the element.

<Electronic Components>

Next, examples of electronic components incorporating the chip 4800a are described with reference to FIG. 15C and FIG. 15D.

Figure 15C:
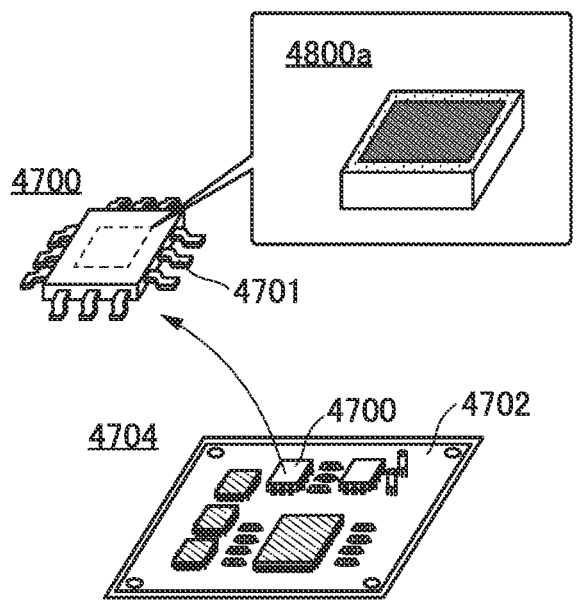

FIG. 15C is a perspective view of an electronic component 4700 and a substrate (a mounting board 4704) on which the electronic component 4700 is mounted. The electronic component 4700 shown in FIG. 15C includes a lead 4701 and the above-described chip 4800a, and functions as an IC chip or the like.

The electronic component 4700 can be formed by, for example, a wire bonding step of electrically connecting the lead 4701 of a lead frame to an electrode on the chip 4800a with a metal fine line (wire), a molding step of performing sealing with an epoxy resin or the like, a plating step on the lead 4701 of the lead frame, and a printing step on a surface of the package. Ball bonding or wedge bonding, for example, can be used in the wire bonding step. Although a QFP (Quad Flat Package) is used as the package of the electronic component 4700 in FIG. 15C, the mode of the package is not limited thereto.

The electronic component 4700 is mounted on a printed circuit board 4702, for example. A plurality of such IC chips are combined and electrically connected to each other on the printed circuit board 4702, whereby the mounting board 4704 is completed.

Figure 15D:
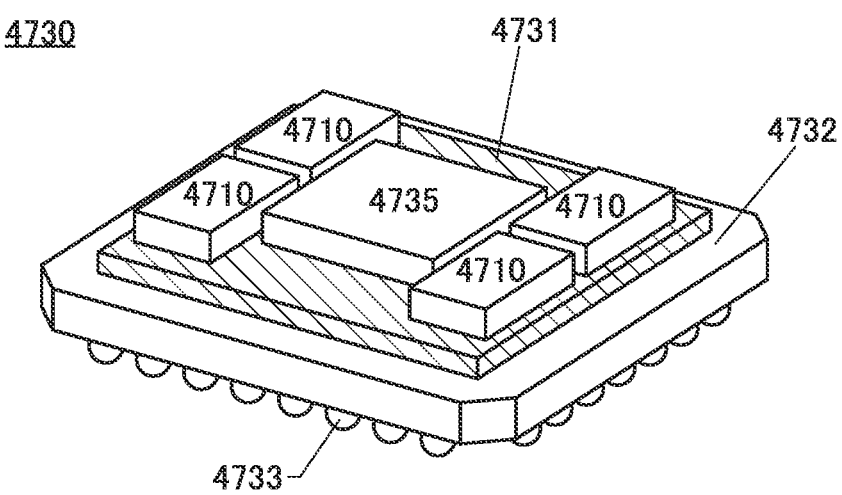

FIG. 15D is a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor devices 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is sometimes referred to as a "redistribution substrate" or an "intermediate substrate". A through electrode may be provided in the interposer 4731 and used to electrically connect an integrated circuit and the package substrate 4732. For a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 15D shows an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with other embodiments or an example in this specification as appropriate.

Embodiment 6

This embodiment will show examples of electronic devices including the semiconductor device described in the above embodiment. FIG. 16A to FIG. 16J and FIG. 17A to FIG. 17E show electronic devices each of which includes the electronic component 4700 including the semiconductor device.

[Mobile Phone]

An information terminal 5500 shown in FIG. 6A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

By using the semiconductor device described in the above embodiments, the information terminal 5500 can hold a temporary file generated at the time of executing an application (e.g., a web browser's cache).

[Wearable Terminal]

Figure 16A:
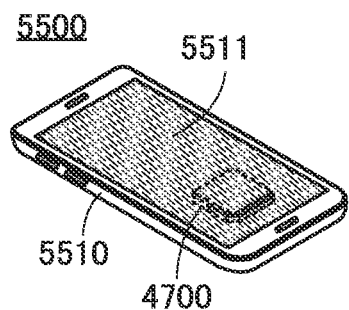
FIG. 16A, FIG. 16B, FIG. 16C, FIG. 16D, FIG. 16E, FIG. 16F, FIG. 16G, FIG. 16H, FIG. 16I, and FIG. 16J are perspective views showing examples of products.
Figure 16B:
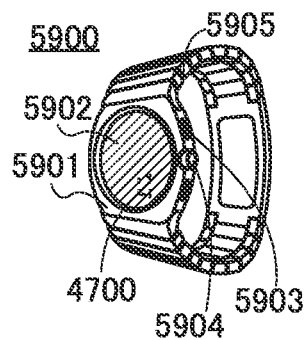

FIG. 16B shows a smart watch 5900 as an example of a wearable terminal. The smart watch 5900 includes a housing 5901, a display portion 5902, an operation button 5903, an operator 5904, a band 5905, and the like.

The wearable terminal can hold a temporary file generated at the time of executing an application with the use of the semiconductor device described in the above embodiment, like the information terminal 5500 described above.

[Information Terminal]

Figure 16C:
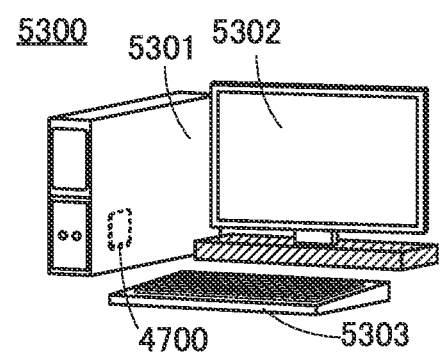

FIG. 16C shows a desktop information terminal 5300. The desktop information terminal 5300 includes a main body 5301 of the information terminal, a display 5302, and a keyboard 5303.

The desktop information terminal 5300 can hold a temporary file generated at the time of executing an application with the use of the semiconductor device described in the above embodiment, like the information terminal 5500 described above.

Note that although the smartphone and the desktop information terminal are respectively shown in FIG. 16A and FIG. 16C as examples of the electronic device, one embodiment of the present invention can be applied to an information terminal other than the smartphone and the desktop information terminal. Examples of an information terminal other than a smartphone and a desktop information terminal include a PDA (Personal Digital Assistant), a laptop information terminal, and a workstation.

[Household Appliance]

Figure 16D:
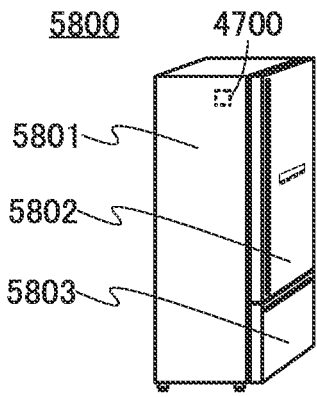

FIG. 16D shows an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiments is used in the electric refrigerator-freezer 5800, the electric refrigerator-freezer 5800 can be used as IoT (Internet of Things), for example. Being used as IoT, the electric refrigerator-freezer 5800 can send and receive data on food stored in the electric refrigerator-freezer 5800 and food expiration dates, for example, to/from the information terminal described above and the like via the Internet. The electric refrigerator-freezer 5800 can retain the data as a temporary file in the semiconductor device when sends the data.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machines]

Figure 16E:
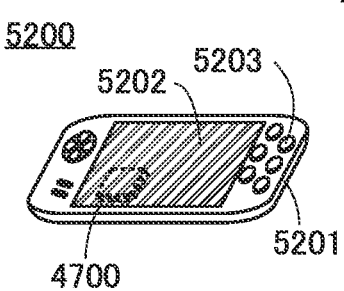

FIG. 16E shows a portable game machine 5200 as an example of a game machine. The portable game machine 5200 includes a housing 5201, a display portion 5202, a button 5203, and the like.

Figure 16F:
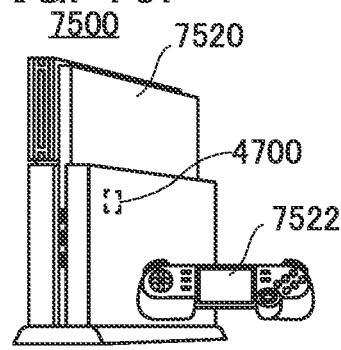

FIG. 16F shows a stationary game machine 7500 as another example of a game machine. The stationary game machine 7500 includes a main body 7520 and a controller 7522. The controller 7522 can be connected to the main body 7520 with or without a wire. Although not shown in FIG. 16F, the controller 7522 can include a display portion that displays a game image, and an input interface besides a button, such as a touch panel, a stick, a rotating knob, and a sliding knob, for example. The shape of the controller 7522 is not limited to that in FIG. 16F, and can be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary gaming machine may include a camera, a depth sensor, a microphone, and the like so that the game player can play a game using a gesture and/or a voice instead of a controller.

Videos displayed on the game machine can be output with a display device such as a television device, a personal computer display, a game display, or a head-mounted display.

The portable game machine 5200 including the semiconductor device described in the above embodiment can have low power consumption. Furthermore, heat generation from a circuit can be reduced owing to low power consumption; thus, the influence of heat generation on the circuit itself, the peripheral circuit, and the module can be reduced.

Moreover, with the use of the semiconductor device described in the above embodiments, the portable game machine 5200 can hold a temporary file necessary for arithmetic operation that occurs during game play.

Although FIG. 16E shows the portable game machine and FIG. 16F shows the home stationary game machine as examples of game machines, the electronic device of one embodiment of the present invention is not limited thereto. Examples of the electronic device of one embodiment of the present invention include an arcade game machine installed in entertainment facilities (e.g., a game center and an amusement park), and a throwing machine for batting practice installed in sports facilities.

[Moving Vehicle]

The semiconductor device described in the above embodiment can be used for an automobile, which is a moving vehicle, and around the driver's seat in an automobile.

Figure 16G:
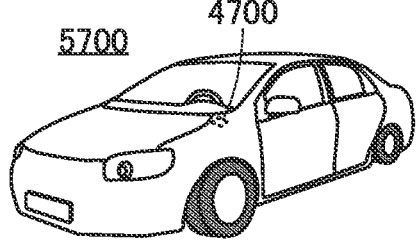

FIG. 16G shows an automobile 5700 as an example of a roving vehicle.

An instrument panel that provides various kinds of information such as a speedometer, a tachometer, a mileage, a fuel meter, a gearshift indicator, and air-conditioning settings is provided around the driver's seat in the automobile 5700. In addition, a display device showing the above information can be provided around the driver's seat.

In particular, the display device can compensate for the view obstructed by the pillar or the like, the blind areas for the driver's seat, and the like by displaying a video taken by an imaging device (not illustrated) provided for the automobile 5700 on the display device, thereby providing a high level of safety.

The semiconductor device described in the above embodiments can temporarily hold data, and thus the computer can be used to hold temporary data necessary in an automatic driving system for the automobile 5700 and a system for navigation and risk prediction, for example. The display device can display temporary information such as navigation information, risk prediction information, or the like. Moreover, the semiconductor device may be configured to hold a video taken by a driving recorder provided on the automobile 5700.

Although an automobile is described above as an example of a moving vehicle, moving vehicles are not limited to an automobile. Examples of moving vehicles include a train, a monorail train, a ship, and a flying object (a helicopter, an unmanned aircraft (a drone), an airplane, and a rocket).

[Camera]

The semiconductor device described in the above embodiment can be used for a camera.

Figure 16H:
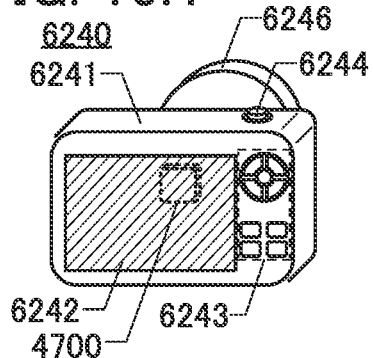

FIG. 16H shows a digital camera 6240 as an example of an imaging device. The digital camera 6240 includes a housing 6241, a display portion 6242, operation buttons 6243, a shutter button 6244, and the like, and an attachable lens 6246 is attached to the digital camera 6240. Here, the lens 6246 of the digital camera 6240 is detachable from the housing 6241 for replacement; alternatively, the lens 6246 may be incorporated into the housing 6241. A stroboscope, a viewfinder, or the like may be additionally provided in the digital camera 6240.

The digital camera 6240 including the semiconductor device described in the above embodiment can have low power consumption. Furthermore, heat generation from a circuit can be reduced owing to low power consumption; thus, the influence of heat generation on the circuit itself, the peripheral circuit, and the module can be reduced.

[Video Camera]

The semiconductor device described in the above embodiment can be used for a video camera.

Figure 16I:
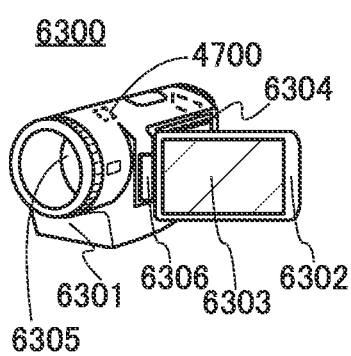

FIG. 16I shows a video camera 6300 as an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of the above semiconductor device, the video camera 6300 can hold a temporary file generated in encoding.

[ICD]

The semiconductor device described in the above embodiment can be used in an implantable cardioverter-defibrillator (ICD).

Figure 16J:
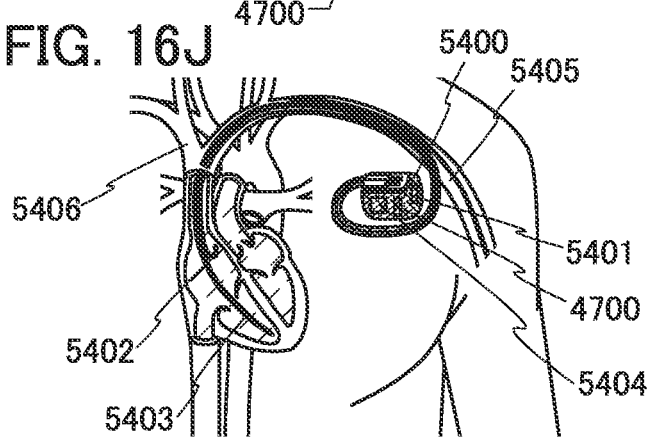

FIG. 16(J) is a schematic cross-sectional view showing an example of an ICD. An ICD main unit 5400 includes at least batteries 5401, an electric component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of the wires placed in the right ventricle and the end of the other wire placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor, the number of times the treatment with pacing is performed, and the time taken for the treatment, for example, can be stored in the electronic component 4700.

The antenna 5404 can receive power, and the power is charged into the battery 5401. When the LCD main unit 5400 includes a plurality of batteries, the safety can be improved. Specifically, even if one of the batteries in the ICD main unit 5400 is dead, the other batteries can work properly; hence, the batteries also function as an auxiliary power source.

Other than the antenna 5404 capable of receiving electric power, an antenna that can transmit physiological signals may be included. For example, a system that monitors the cardiac activity so as to check physiological signals such as a pulse, a respiratory rate, a heart rate, and body temperature with an external monitoring device may be constructed.

[Expansion Device for PC]

The semiconductor device described in the above embodiment can be used for a calculator such as a PC (Personal Computer) and an extension device for an information terminal.

Figure 17A:
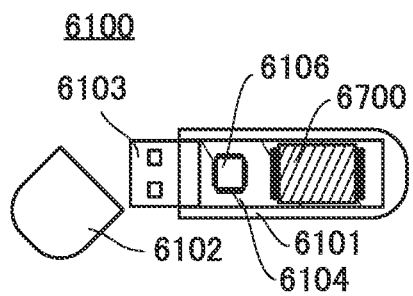
FIG. 17A, FIG. 17B, FIG. 17C, FIG. 17D, and FIG. 17E are perspective views showing examples of products.

FIG. 17A shows, as an example of the extension device, a portable extension device 6100 that includes a chip capable of retaining data and is externally provided on a PC. The extension device 6100 can retain data using the chip when connected to a PC with a USB (Universal Serial Bus), for example. FIG. 17A shows the portable extension device 6100; however, the extension device of one embodiment of the present invention is not limited thereto and may be a relatively large extension device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device described in the above embodiment or the like. For example, the substrate 6104 is provided with the electronic component 4700 and a controller chip 6106. The USB connector 6103 functions as an interface for connection to an external device.

[SD Card]

The semiconductor device described in the above embodiment can be used in an SD card that can be attached to electronic devices such as an information terminal and a digital camera.

Figure 17B:
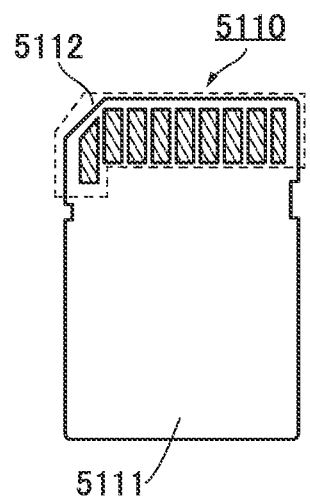
Figure 17C:
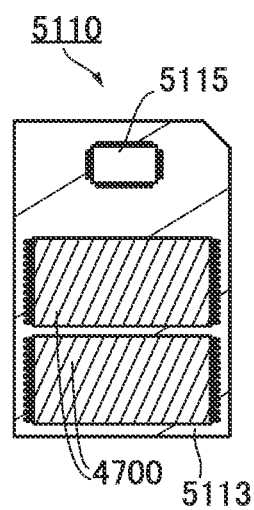

FIG. 17B is a schematic external view of an SD card, and FIG. 17C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, electronic components 4700 and a controller chip 5115 are attached to the substrate 5113. Note that the circuit configurations of the electronic components 4700 and the controller chip 5115 are not limited to those described above, and can be changed as appropriate according to circumstances or depending on the case. For example, a write circuit, a row driver, a read circuit, and the like that are provided in an electronic component may be incorporated into the controller chip 5115 instead of the electronic component 4700.

When the electronic components 4700 are provided also on a rear surface side of the substrate 5113, the capacitance of the SD card 5110 can be increased. In addition, a wireless chip with a wireless communication function may be provided on the substrate 5113. By this, wireless communication between an external device and the SD card 5110 can be conducted, which enables data reading out and writing from/to the electronic components 4700.

[SSD]

The semiconductor device described in the above embodiment can be used in a solid state drive (SSD) that can be attached to electronic devices such as information terminals.

Figure 17D:
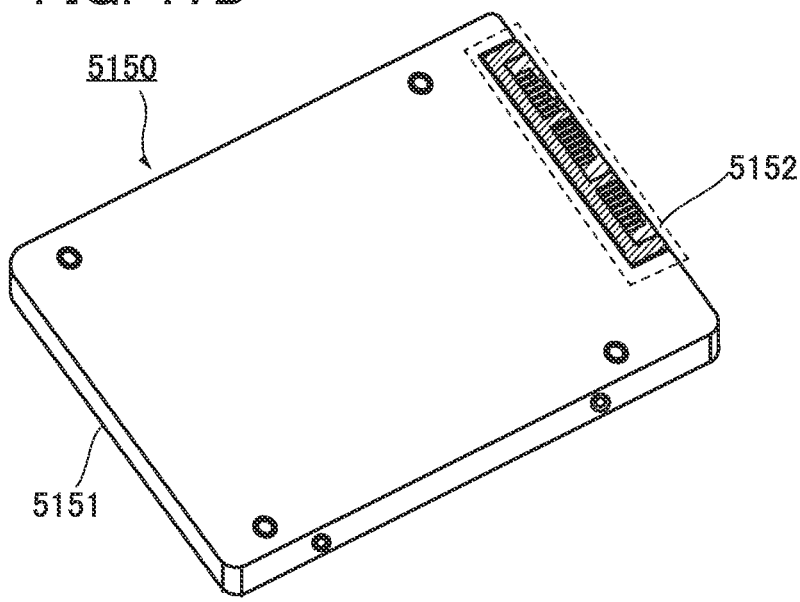
Figure 17E:
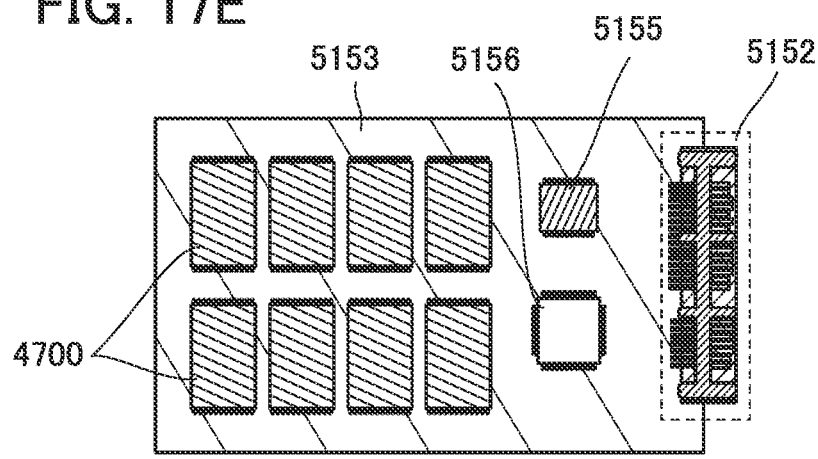

FIG. 17D is a schematic external view of an SSD, and FIG. 17E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the electronic components 4700, a memory chip 5155, and a controller chip 5156 are attached to the substrate 5153. When the electronic components 4700 are also provided on a rear surface side of the substrate 5153, the capacitance of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit configurations of the electronic components 4700, the memory chip 5155, and the controller chip 5115 are not limited to those described above, and can be changed as appropriate according to circumstances or depending on the case. For example, a memory functioning as a work memory can also be provided in the controller chip 5156.

Note that this embodiment can be combined with any of the other embodiments in this specification as appropriate.

REFERENCE NUMERALS

MCL: memory cell unit, OSC: peripheral circuit, OSM: circuit, WLD: circuit, BLD: circuit, BLDa: circuit, OPC: output circuit, CD: column decoder, SA: sense amplifier, PRC: precharge circuit, WC: write circuit, CVC: circuit, ESC: circuit, ESCa: circuit, ESCb: circuit, MCA: memory cell array, SRG: string, SRGJ: string, MC: memory cell, MC[1, 1]: memory cell, MC[i, 1]: memory cell, MC[m, 1]: memory cell, MC[1, j]: memory cell, MC[i, j]: memory cell, MC[m, j]: memory cell, MCJ: redundant memory cell, MCJ[1]: redundant memory cell, MCJ[i]: redundant memory cell, MCJ[m]: redundant memory cell, BTr: transistor, STr: transistor, CTr: transistor, SW[1]: switch, SW[j]: switch, SW[n]: switch, SWJ: switch, SX[1]: switch, SX[j]: switch, TR: transistor, TR1: transistor, TR2: transistor, SX[n]: switch, EW: wiring, WL: wiring, BL: wiring, BLJ: CL: wiring, BSL: wiring, SSL: wiring, ST1-0: step, ST1-1: step, ST1-2: step, ST1-3: step, ST1-4: step, ST1-5: step, ST1-6: step, ST1-7: step, ST2-0: step, ST2-1: step, ST2-2: step, ST2-3: step, ST2-4: step, ST2-5: step, ST2-6: step, M1: transistor, M2: transistor, M3: transistor, M4: transistor, M4r: transistor, M5: transistor, M5r: transistor, C1: capacitor, C2: capacitor, C3: capacitor, C3r: capacitor, VR: variable resistor, MR: MTJ element, PCM: phase-change memory, WL[1]: WL[m]: wiring, W1L: wiring, W2L: wiring, RBL: wiring, RBLJ: wiring, WBL: wiring, WBLJ: wiring, SL: wiring, SLJ: wiring, C1L: wiring, C2L: wiring, BLB: wiring, INV1: logic circuit, INV2: logic circuit, INV3: logic circuit, 100: memory portion, 111: insulator, 112: insulator, 113: insulator, 114: insulator, 115: insulator, 116: insulator, 117: insulator, 121: insulator, 122: insulator, 131: insulator, 132: insulator, 133: insulator, 141: semiconductor, 142: semiconductor, 143: semiconductor, 151: conductor, 152: conductor, 153: conductor, 154: conductor, 155: conductor, 156: conductor, 200: control portion, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 503: conductor, 503a: conductor, 503b: conductor, 505: conductor, 510: insulator, 512: insulator, 514: insulator, 516: insulator, 518: conductor, 520: insulator, 522: insulator, 524: insulator, 526: insulator, 530: oxide, 530a: oxide, 530b: oxide, 530c: oxide, 540a: conductor, 540b: conductor, 542a: conductor, 542b: conductor, 543a: region, 543b: region, 544: insulator, 546: conductor, 548: conductor, 550: insulator, 560: conductor, 560a: conductor, 560b: conductor, 574: insulator, 580: insulator, 581: insulator, 582: insulator, 586: insulator, 610: conductor, 612: conductor, 630: insulator, 640: insulator, 700: transistor, 800: transistor, 900: transistor, 4700: electronic component, 4701: lead, 4702: printed circuit board, 4704: mounting board, 4710: semiconductor device, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5110: SD card, 5111: housing, 5112: connector, 5113: substrate, 5115: controller chip, 5150: SSD, 5151: housing, 5152: connector, 5153: substrate, 5155: memory chip, 5156: controller chip, 5200: portable game machine, 5201: housing, 5202: display portion, 5203: button, 5300: desktop information terminal, 5301: main body, 5302: display; 5303: keyboard, 5400: ICD main unit, 5401: battery, 5402: wire, 5403: wire, 5404: antenna, 5405: subclavian vein, 5406: superior vena cava, 5500: information terminal, 5510: housing, 5511: display portion, 5700:

automobile, 5800: electric refrigerator-freezer, 5801: housing, 5802: refrigerator door, 5803: freezer door, 5901: housing, 5902: display portion, 5903: operation button, 5904: operator, 5905: band, 6100: expansion device, 6101: housing, 6102: cap, 6103: USB connector, 6104: substrate, 6106: controller chip, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 7520: main body, 7522: controller

The invention claimed is:

1. A semiconductor device comprising:
a first circuit;
an insulator over the first circuit; and
a second circuit over the insulator,
wherein the first circuit is electrically connected to the second circuit,
wherein the first circuit comprises a first memory cell and a second memory cell,
wherein the second circuit comprises a third circuit and a fourth circuit,
wherein the first memory cell is electrically connected to the third circuit,
wherein the second memory cell is electrically connected to the third circuit,
wherein the third circuit is electrically connected to the fourth circuit,
wherein the fourth circuit is configured to send data to be written to the first memory cell or the second memory cell to the third circuit, and
wherein the third circuit is configured to bring an electrical connection between the first memory cell and the fourth circuit into a non-conduction state and to bring an electrical connection between the second memory cell and the fourth circuit into a conduction state to send the data to the second memory cell when the first memory cell is a defective cell.

2. The semiconductor device according to claim 1,
wherein the third circuit comprises a first switch and a second switch,
wherein the first memory cell is electrically connected to a first terminal of the first switch,
wherein a second terminal of the first switch is electrically connected to the fourth circuit,
wherein the second memory cell is electrically connected to a first terminal of the second switch, and
wherein a second terminal of the second switch is electrically connected to the fourth circuit.

3. The semiconductor device according to claim 2,
wherein the third circuit comprises a fifth circuit,
wherein the fifth circuit is electrically connected to a control terminal of the first switch and a control terminal of the second switch, and
wherein the fifth circuit is configured to input a first voltage to the control terminal of the first switch to bring the first switch into a non-conduction state and to input a second voltage to the control terminal of the second switch to bring the second switch into a conduction state when the fifth circuit receives a signal including information in which the first memory cell is a defective cell.

4. The semiconductor device according to claim 2,
wherein the first switch comprises a first transistor,
wherein the second switch comprises a second transistor, and
wherein the first transistor and the second transistor each comprise a metal oxide in its channel formation region.

5. The semiconductor device according to claim 1,
wherein the third circuit comprises a third switch,
wherein the third switch comprises a first terminal, a second terminal, a third terminal, and a control terminal,
wherein the first terminal of the third switch is electrically connected to the fourth circuit,
wherein the second terminal of the third switch is electrically connected to the first memory cell,
wherein the third terminal of the third switch is electrically connected to the second memory cell, and
wherein the third switch is configured to bring the first terminal of the third switch and one of the second terminal or the third terminal of the third switch into a conduction state and to bring the first terminal of the third switch and the other of the second terminal or the third terminal of the third switch into a non-conduction state depending on a voltage input to the control terminal.

6. The semiconductor device according to claim 5,
wherein the third circuit comprises a fifth circuit,
wherein the fifth circuit is electrically connected to the control terminal of the third switch, and
wherein the fifth circuit inputs a voltage which brings the first terminal and the second terminal of the third switch into a non-conduction state and the first terminal and the third terminal of the third switch into a conduction state when the fifth circuit receives information in which the first memory cell is a defective cell.

7. The semiconductor device according to claim 6,
wherein the third switch comprises a third transistor, and
wherein the third transistor comprises a metal oxide in its channel formation region.

8. The semiconductor device according to claim 1,
wherein the second circuit is composed of a single-polarity circuit.

9. The semiconductor device according to claim 1,
wherein the first circuit comprises a NAND memory device, and
wherein the NAND memory device comprises the first memory cell and the second memory cell.

\* \* \* \* \*